(12) United States Patent
Noda et al.

(10) Patent No.: US 8,581,192 B2
(45) Date of Patent: Nov. 12, 2013

(54) PYROELECTRIC DETECTOR AND METHOD FOR MANUFACTURING SAME, PYROELECTRIC DETECTION DEVICE, AND ELECTRONIC INSTRUMENT

(75) Inventors: Takafumi Noda, Nagano (JP); Jun Takizawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 177 days.

(21) Appl. No.: 13/069,793

(22) Filed: Mar. 23, 2011

(65) Prior Publication Data

US 2011/0233408 A1     Sep. 29, 2011

(30) Foreign Application Priority Data

Mar. 26, 2010 (JP) ................................. 2010-072080

(51) Int. Cl.
*G01J 5/00* (2006.01)
*H01L 21/00* (2006.01)

(52) U.S. Cl.
USPC .......................................... 250/338.3; 438/54

(58) Field of Classification Search
USPC ......... 250/338.3; 257/467, E21.002, E29.347
See application file for complete search history.

(56) References Cited

U.S. PATENT DOCUMENTS

| | | | |
|---|---|---|---|
| 7,223,614 B2 | 5/2007 | Takano | |
| 7,602,068 B2 * | 10/2009 | Coolbaugh et al. | ............ 257/773 |
| 7,812,385 B2 | 10/2010 | Noda | |
| 7,825,027 B2 | 11/2010 | Noda et al. | |
| 7,938,569 B2 | 5/2011 | Cheng | |
| 2001/0023090 A1 * | 9/2001 | Lee | ................................. 438/149 |
| 2004/0053435 A1 * | 3/2004 | Ikushima et al. | ................ 438/57 |
| 2006/0060788 A1 | 3/2006 | Uchida et al. | |
| 2006/0183265 A1 * | 8/2006 | Oh et al. | ........................... 438/65 |
| 2007/0134817 A1 | 6/2007 | Noda | |
| 2007/0235782 A1 * | 10/2007 | Fukada | ........................... 257/295 |

(Continued)

FOREIGN PATENT DOCUMENTS

| | | |
|---|---|---|
| EP | 0417846 A2 | 3/1991 |
| JP | 06-281503 A | 10/1994 |

(Continued)

OTHER PUBLICATIONS

Pyroelectricity. (2007). In the Penguin English Dictionary. Retrieved from http://www.credoreference.com/entry/penguineng/pyroelectricity.*

(Continued)

*Primary Examiner* — David Porta
*Assistant Examiner* — Abra Fein
(74) *Attorney, Agent, or Firm* — Global IP Counselors, LLP

(57) ABSTRACT

A pyroelectric detector includes a pyroelectric detection element, a support member, a fixing part and a first reducing gas barrier layer. A first side of the support member faces a cavity and the pyroelectric detection element is mounted and supported on a second side opposite from the first side. An opening part communicated with the cavity is formed on a periphery of the support member in plan view from the second side of the support member. The fixing part supports the support member. The first reducing gas barrier layer covers a first surface of the support member on the first side, a side surface of the support member facing the opening part, and a part of a second surface of the support member on the second side and the pyroelectric detection element exposed as viewed from the second side of the support member.

12 Claims, 13 Drawing Sheets

(56) References Cited

U.S. PATENT DOCUMENTS

| | | | |
|---|---|---|---|
| 2008/0290491 A1* | 11/2008 | Yamano et al. | 257/686 |
| 2008/0303074 A1 | 12/2008 | Noda | |
| 2009/0068763 A1 | 3/2009 | Noda | |
| 2009/0072287 A1* | 3/2009 | Noda | 257/295 |
| 2009/0127604 A1 | 5/2009 | Noda | |
| 2009/0296097 A1* | 12/2009 | He et al. | 356/451 |

FOREIGN PATENT DOCUMENTS

| | | |
|---|---|---|
| JP | 09-061238 A | 8/1995 |
| JP | 07-273306 A | 10/1995 |
| JP | 2004-296929 A | 10/2004 |
| JP | 2006-005234 A | 1/2006 |
| JP | 2006-071601 A | 3/2006 |
| JP | 2006-177712 A | 7/2006 |
| JP | 2006-244941 A | 9/2006 |
| JP | 2007-150025 A | 6/2007 |
| JP | 2008-218782 A | 9/2008 |
| JP | 2008-232896 A | 10/2008 |
| JP | 2008-262896 A | 10/2008 |
| JP | 2009-065089 A | 3/2009 |
| JP | 2009-071022 A | 4/2009 |
| JP | 2009-071241 A | 4/2009 |
| JP | 2009-071242 A | 4/2009 |
| JP | 2009-124017 A | 6/2009 |
| JP | 2009-129972 A | 6/2009 |
| JP | 2009-130188 A | 6/2009 |
| JP | 2009-141179 A | 6/2009 |
| WO | WO-99/09383 A1 | 2/1999 |

OTHER PUBLICATIONS

The Extended European Search Report dated Dec. 20, 2011 for the corresponding European Patent Application No. 11159538.5.

* cited by examiner

PYROELECTRIC DETECTOR AND METHOD FOR MANUFACTURING SAME, PYROELECTRIC DETECTION DEVICE, AND ELECTRONIC INSTRUMENT

CROSS-REFERENCE TO RELATED APPLICATIONS

This application claims priority to Japanese Patent Application No. 2010-072080 filed on Mar. 26, 2010. The entire disclosure of Japanese Patent Application No. 2010-072080 is hereby incorporated herein by reference.

BACKGROUND

1. Technical Field

The present invention relates to a pyroelectric detector and a method for manufacturing the same, to a pyroelectric detection device, and to an electronic instrument or the like.

2. Related Art

Known thermo-optical detection devices include pyroelectric or bolometer-type infrared detection devices. An infrared detection device utilizes a change (pyroelectric effect or pyroelectronic effect) in the amount of spontaneous polarization of a pyroelectric material according to the light intensity (temperature) of received infrared rays to create an electromotive force (charge due to polarization) at both ends of the pyroelectric body (pyroelectric-type) or vary a resistance value according to the temperature (bolometer-type) and detect the infrared rays. Compared with a bolometer-type infrared detection device, a pyroelectric infrared detection device is complex to manufacture, but has the advantage of excellent detection sensitivity.

A cell of a pyroelectric infrared detection device has a capacitor which includes a pyroelectric body connected to an upper electrode and a lower electrode, and various proposals have been made regarding the material of the electrodes or the pyroelectric body (Japanese Laid-Open Patent Publication No. 2008-232896).

A capacitor which includes a ferroelectric body connected to an upper electrode and a lower electrode is used in ferroelectric memory, and various proposals have been made regarding the material of the electrodes or the ferroelectric body to be suitable for ferroelectric memory (Japanese Laid-Open Patent Publication No. 2009-71242 and Japanese Laid-Open Patent Publication No. 2009-129972).

SUMMARY

A pyroelectric infrared detection device utilizes the effect (pyroelectric effect) whereby the amount of spontaneous polarization of the pyroelectric material varies according to temperature, and therefore differs significantly from ferroelectric memory in having a structure in which heat does not readily escape from the capacitor. A pyroelectric detection element is mounted on a membrane supported by a substrate. A cavity is formed between the membrane and the substrate in a region facing the pyroelectric detection element.

In a pyroelectric infrared detector, the characteristics of the pyroelectric body of the capacitor are degraded when oxygen deficit occurs due to reducing gas.

An object of the several aspects of the present invention is to provide a pyroelectric detector having a structure in which reducing gas does not readily penetrate, although light is incident on the pyroelectric detection element, and a method for manufacturing the pyroelectric detector, and to provide a pyroelectric detection device and an electronic instrument.

A pyroelectric detector according to one aspect of the present invention includes a pyroelectric detection element, a support member, a fixing part and a first reducing gas barrier layer. The support member includes a first side and a second side opposite from the first side, with the first side facing a cavity and the pyroelectric detection element being mounted and supported on the second side. An opening part communicated with the cavity is formed on a periphery of the support member in plan view from the second side of the support member. The fixing part supports the support member. The first reducing gas barrier layer covers a first surface of the support member on the first side, a side surface of the support member facing the opening part, and a part of a second surface of the support member on the second side and the pyroelectric detection element exposed as viewed from the second side of the support member.

In the pyroelectric detector, the characteristics of the pyroelectric body included in the pyroelectric detection element are degraded when an oxygen deficit occurs therein due to reducing gas ($H_2$, OH groups, or the like). Therefore, since a sacrificial layer is etched by an etchant having reducing properties, e.g., hydrofluoric acid or the like, in a step subsequent to completion of the support member and the pyroelectric detection element, it is extremely important that reducing gas barrier properties be maintained in the pyroelectric detector.

In an embodiment of the present invention, the entire exposed surfaces of the support member and the pyroelectric detection element are covered by a first reducing gas barrier layer. Oxygen deficit in the pyroelectric body due to reducing gas can thereby be suppressed even when the pyroelectric infrared detector is exposed to a reducing gas atmosphere during etching removal of the sacrificial layer that is embedded in the cavity in order to form the support member and the pyroelectric detection element, after the support member and the pyroelectric detection element are formed, or in the usage environment after completion of the support member and the pyroelectric detection element. The barrier layer formed on the first surface at which the support member faces the cavity in the first reducing gas barrier layer can also block reductive obstructive factors from below the support member during high-temperature processing (such as during degassing or baking of the pyroelectric body) in manufacturing to form the pyroelectric detection element on the support member. Furthermore, the first reducing gas barrier layer can also serve as an etching stop layer when the sacrificial layer is etched during manufacturing of the pyroelectric detector.

In the pyroelectric detector as described above, the pyroelectric detection element preferably includes a capacitor including a pyroelectric body between a first electrode and a second electrode such that an amount of polarization is varied based on a temperature, and a light-absorbing member configured to absorb light and to convert the light to heat. The light-absorbing member is preferably disposed towards an external side of the pyroelectric detection element. The first reducing gas barrier layer preferably covers the light-absorbing member Reductive obstructive factors from the side of the light-absorbing member can thereby be blocked by the first reducing gas barrier layer. The first reducing gas barrier layer can also serve as an etching stop layer for preventing the light-absorbing member from being etched during etching of the sacrificial layer.

In the pyroelectric detector as described above, the first electrode of the capacitor is preferably disposed on the support member. The capacitor preferably includes a plug connected to the second electrode. The light-absorbing member preferably covers the plug.

In an aspect of the present invention, the light-absorbing member is not limited to being formed so as to cover the plug, and the light-absorbing member may also be adapted so as to be formed in overhanging fashion by a thin layer member in a so-called umbrella-type configuration, but in a case in which the light-absorbing member is formed so as to cover the plug, reductive obstructive factors penetrating from the plug can be blocked by the first reducing gas barrier layer. The first electrode positioned further toward the support member than the second electrode may be mounted directly on the first surface of the support member, or may be mounted via another layer.

In the pyroelectric detector as described above, a second reducing gas barrier layer preferably coats at least a side surface of the capacitor. a layer thickness of a part of the first reducing gas barrier layer covering the part of the second surface of the support member on the second side and the pyroelectric detection element is preferably less than a layer thickness of the second reducing gas barrier layer.

Through this configuration, adverse effects on light transmission characteristics are reduced by reducing the thickness of the first reducing gas barrier layer provided in the path of light incidence.

The pyroelectric detector as described above preferably further includes an electrical insulation layer having a contact hole filled by the plug, the electrical insulation layer covering the second reducing gas barrier layer, an electrode wiring layer formed on the electrical insulation layer and connected to the plug, and a passivation layer disposed outwardly of the electrical insulation layer and electrode wiring layer. The electrical insulation layer preferably has a smaller amount of reducing gas component than the passivation layer.

Through this configuration, it is possible to reduce the occurrence of a phenomenon whereby the electrical insulation layer adjacent to the second reducing gas barrier layer causes degassing. Since the release of gas from the electrical insulation layer is thereby reduced even when annealing is performed subsequent to the step of forming the electrical insulation layer, the barrier properties of the second reducing gas barrier layer can be maintained. The component amount of reducing gas can also be reduced by subjecting the electrical insulation layer to a degassing treatment, for example, after formation of the electrical insulation layer.

The pyroelectric detector as described above preferably further includes a third reducing gas barrier layer disposed between the passivation layer and the electrical insulation layer and the electrode wiring layer.

Through this configuration, even when the contact hole is formed in the second reducing gas barrier layer, and the barrier properties of the second reducing gas barrier layer are lost, the passage route of reducing gas can be blocked by the third reducing gas barrier layer.

A pyroelectric detection device according to another aspect of the present invention includes a plurality of the pyroelectric detectors described above, arranged in two dimensions along two axes. In this pyroelectric detection device, the detection sensitivity is increased in the pyroelectric detector of each cell, and a distinct light (temperature) distribution image can therefore be provided.

An electronic instrument according to another aspect of the present invention has the pyroelectric detector or pyroelectric detection device described above, and by using one or a plurality of cells of the pyroelectric detector as a sensor, the electronic instrument is most suitable in thermography for outputting a light (temperature) distribution image, in automobile navigation and surveillance cameras as well as object analysis instruments (measurement instruments) for analyzing (measuring) physical information of objects, in security instruments for detecting fire or heat, in FA (Factory Automation) instruments provided in factories or the like, and in other applications.

A method for manufacturing a pyroelectric detector according to another aspect of the present invention includes: forming a first etching stop layer on a wall part for defining a cavity; forming a sacrificial layer on the first etching stop layer; forming a second etching stop layer having reducing gas barrier properties on the sacrificial layer; forming a support member and a pyroelectric detection element on the second etching stop layer; pattern etching the support member and partially removing the second etching stop layer to form an opening part on a periphery of the support member in plan view; forming a third etching stop layer covering an external surface of the support member and the pyroelectric detection element that are exposed and a side surface of the support member facing the opening part, the third etching stop layer having reducing gas barrier properties; and introducing an etchant via the opening part and etching the sacrificial layer to form the cavity between the first etching stop layer and the second etching stop layer.

The second and third etching stop layers used in this other aspect of the present invention function as etching stop layers, and can also remain in a pyroelectric thermal detector to function as the first reducing gas barrier layer of a pyroelectric thermal detector according to an aspect of the present invention.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the present invention will be described in detail. The embodiments described below do not unduly limit the scope of the present invention as recited in the claims, and all of the configurations described in the embodiments are not necessarily essential means of achievement of the present invention.

1. Pyroelectric Infrared Detection Device

Figure 1:
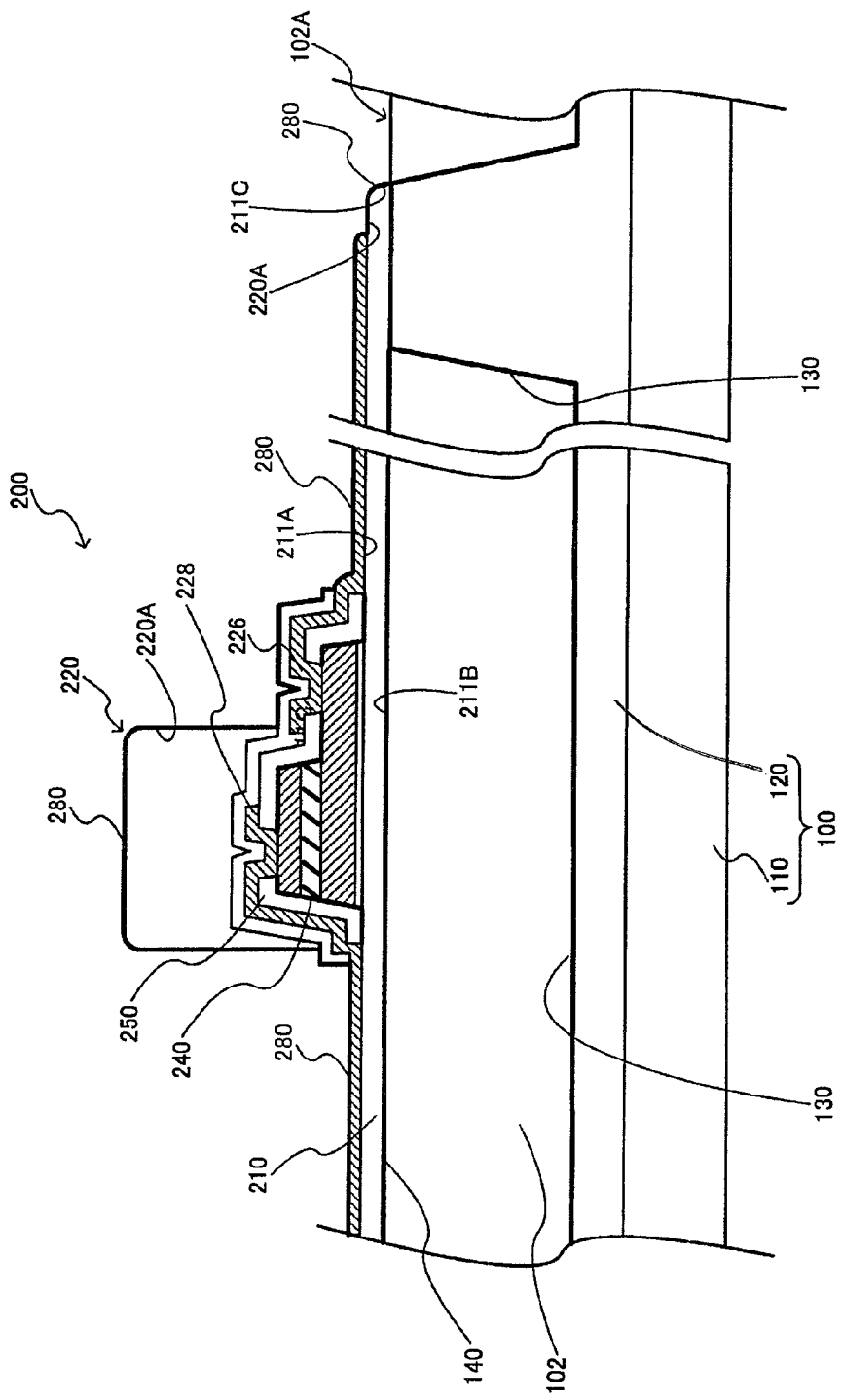
FIG. 1 is a simplified sectional view showing the reducing gas barrier layer of the pyroelectric infrared detector according to an embodiment of the present invention.
Figure 2:
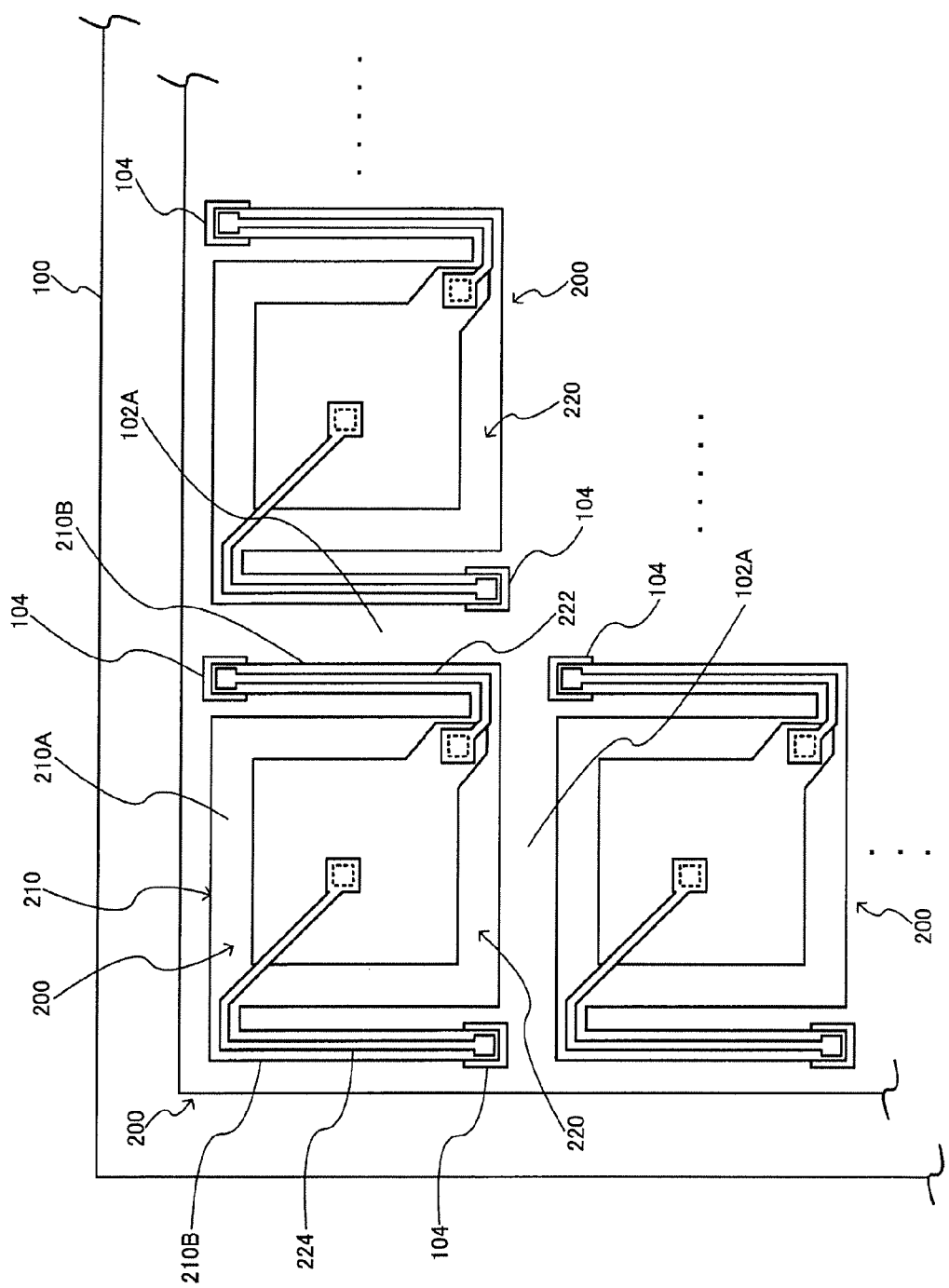
FIG. 2 is a simplified plan view showing the pyroelectric infrared detection device according to an embodiment of the present invention.

FIG. 2 shows a pyroelectric infrared detection device (one example of a pyroelectric detection device) in which a plurality of cells of pyroelectric infrared detectors (one example of pyroelectric detectors) 200 is arranged along two orthogonal axes, each cell being provided with the first reducing gas barrier membranes shown in FIG. 1. A pyroelectric infrared detection device may also be formed by a pyroelectric infrared detector of a single cell. In FIG. 2, a plurality of posts 104 is provided upright from a base part (also referred to as a fixing part) 100, and pyroelectric infrared detectors 200, each cell of which is supported by two posts 104, for example, are arranged along two orthogonal axes. The area occupied by each cell of pyroelectric infrared detectors 200 is 30×30 μm, for example.

As shown in FIG. 2, each pyroelectric infrared detector 200 includes a support member (membrane) 210 linked to two posts 104, and an infrared detection element (one example of a pyroelectric detection element) 220. The area occupied by the pyroelectric infrared detection element 220 of one cell is 10×10 μm, for example.

Besides being connected to the two posts 104, the pyroelectric infrared detector 200 of each cell is in a non-contacting state, a cavity 102 (see FIG. 3) is formed below the pyroelectric infrared detector 200, and opening parts 102A communicated with the cavity 102 are provided on the periphery of the pyroelectric infrared detector 200 in plan view. The pyroelectric infrared detector 200 of each cell is thereby thermally separated from the base part 100 as well as from the pyroelectric infrared detectors 200 of other cells.

The support member 210 has a mounting part 210A for mounting and supporting the pyroelectric infrared detection element 220, and two arms 210B linked to the post 104. The two arms 210B are formed so as to extend redundantly and with a narrow width in order to thermally separate the pyroelectric infrared detection element 220.

FIG. 2 is a plan view which omits the members above the wiring layers connected to the upper electrodes, and FIG. 2 shows a first electrode (lower electrode) wiring layer 222 and a second electrode (upper electrode) wiring layer 224 connected to the pyroelectric infrared detection element 220. The first and second electrode wiring layers 222, 224 extend along the arms 210B, and are connected to a circuit inside the base part 100 via the posts 104. The first and second electrode wiring layers 222, 224 are also formed so as to extend redundantly and with a narrow width in order to thermally separate the pyroelectric infrared detection element 220.

2. Overview of the Pyroelectric Infrared Detector

Figure 3:
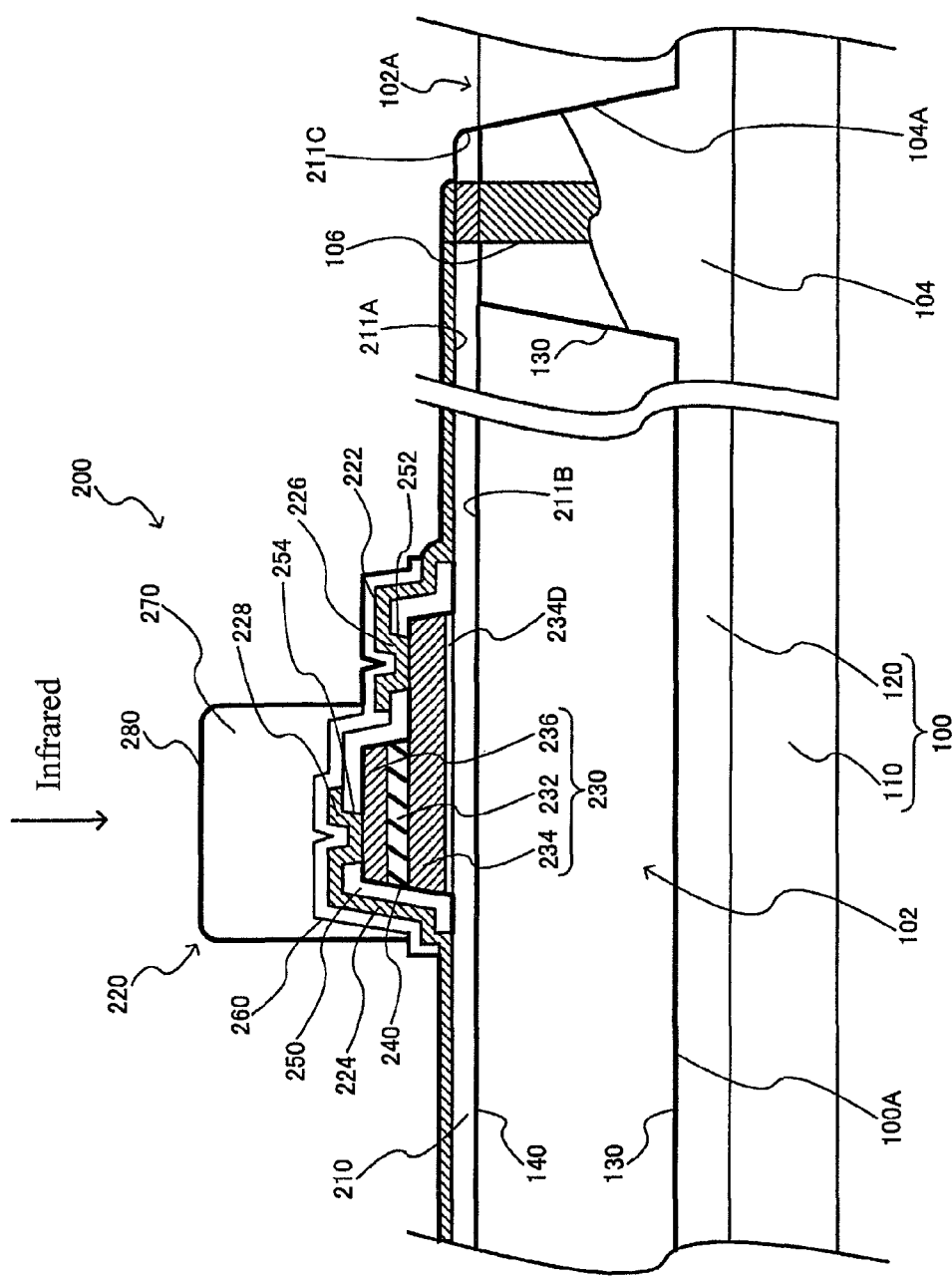
FIG. 3 is a simplified sectional view showing the pyroelectric detector of one cell of the pyroelectric infrared detection device shown in FIG. 2.
Figure 4:
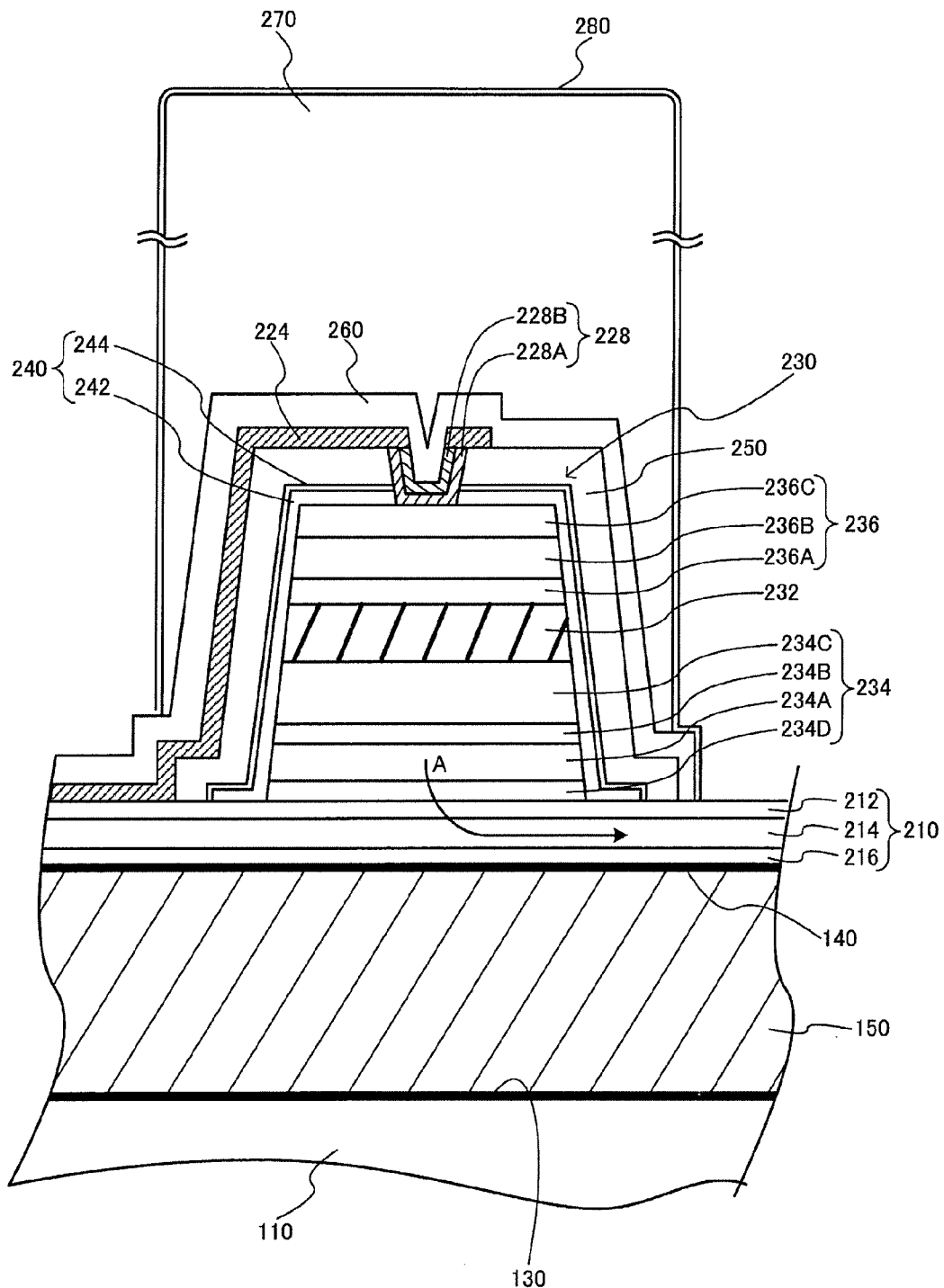
FIG. 4 is a simplified sectional view showing a manufacturing step, and shows the support member and infrared detection element formed on the sacrificial layer.

FIG. 3 is a sectional view showing the pyroelectric infrared detector 200 shown in FIG. 2. FIG. 4 is a partial sectional view showing the pyroelectric infrared detector 200 during the manufacturing process. In FIG. 4, the cavity 102 is embedded by a sacrificial layer 150. The sacrificial layer 150 is present from before the step of forming the support member 210 and the pyroelectric infrared detection element 220 until after this formation step, and is removed by isotropic etching after the step of forming the pyroelectric infrared detection element 220.

As shown in FIG. 3, the base part 100 includes a substrate, e.g., a silicon substrate 110, and a spacer layer 120 formed by an interlayer insulation layer on the silicon substrate 110. The post 104 is formed by etching the spacer layer 120. A plug 106 connected to one of the first and second electrode wiring layers 222, 224 may be disposed at the post 104. The plug 106 is connected to a row selection circuit (row driver) provided to the silicon substrate 110, or a read circuit for reading data from an optical detector via a column line. The cavity 102 is formed at the same time as the post 104 by etching the spacer layer 120. The opening parts 102A shown in FIG. 2 are formed by pattern etching the support member 210.

The pyroelectric infrared detection element 220 mounted on the support member 210 includes a capacitor 230. The capacitor 230 includes a pyroelectric body 232, a first electrode (lower electrode) 234 connected to the lower surface of the pyroelectric body 232, and a second electrode (upper electrode) 236 connected to the upper surface of the pyroelectric body 232. The first electrode 234 may include an adhesive layer 234D for increasing adhesion to a first layer member (e.g., $SiO_2$) of the support member 210.

The capacitor 230 is covered by a reducing gas barrier layer (second reducing gas barrier layer) 240 for suppressing penetration of reducing gas (hydrogen, water vapor, OH groups, methyl groups, and the like) into the capacitor 230 during steps after formation of the capacitor 230. The reason for this is that the pyroelectric body (e.g., PZT or the like) 232 of the capacitor 230 is an oxide, and when an oxide is reduced, oxygen deficit occurs and the pyroelectric effects are compromised.

The reducing gas barrier layer 240 includes a first barrier layer 242 and a second barrier layer 244, as shown in FIG. 4. The first barrier layer 242 can be formed by forming a layer of aluminum oxide $Al_2O_3$, for example, by sputtering. Since reducing gas is not used in sputtering, no reduction of the capacitor 230 occurs. The second barrier layer 244 can be formed by forming a layer of aluminum oxide $Al_2O_3$, for example, by Atomic Layer Chemical Vapor Deposition (AL-CVD), for example. Common CVD (Chemical Vapor Deposition) methods use reducing gas, but the capacitor 230 is isolated from the reducing gas by the first barrier layer 242.

The total layer thickness of the reducing gas barrier layer 240 herein is 50 to 70 nm, e.g., 60 nm. At this time, the layer thickness of the first barrier layer 242 formed by CVD is greater than that of the second barrier layer 244 formed by Atomic Layer Chemical Vapor Deposition (ALCVD), and is 35 to 65 nm, e.g., 40 nm, at minimum. In contrast, the layer thickness of the second barrier layer 244 formed by Atomic Layer Chemical Vapor Deposition (ALCVD) can be reduced; for example, a layer of aluminum oxide $Al_2O_3$ is formed having a thickness of 5 to 30 nm, e.g., 20 nm. Atomic Layer Chemical Vapor Deposition (ALCVD) has excellent embedding characteristics in comparison with sputtering and other methods, and can therefore be adapted for miniaturization, and the reducing gas barrier properties in the first and second barrier layers 242, 244 can be enhanced. The first barrier layer 242 formed by sputtering is not fine in comparison with the second barrier layer 244, but this aspect contributes to lowering the heat transfer rate thereof, and dissipation of heat from the capacitor 230 can therefore be prevented.

An electrical insulation layer (broadly referred to as an electric insulation layer) 250 is formed on the reducing gas barrier layer 240. Hydrogen gas, water vapor, or other reducing gas usually is formed when the starting material gas (TEOS) of the interlayer insulation layer 250 chemically reacts. The reducing gas barrier layer 240 provided on the periphery of the capacitor 230 protects the capacitor 230 from the reducing gas that occurs during formation of the interlayer insulation layer 250.

The first electrode (lower electrode) wiring layer 222 and second electrode (upper electrode) wiring layer 224 shown in FIG. 2 as well are disposed on the interlayer insulation layer 250. A first contact hole 252 and second contact hole 254 are formed in advance in the interlayer insulation layer 250 before formation of the electrode wiring. At this time, a contact hole is formed in the same manner in the reducing gas barrier layer 240 as well. The first electrode (lower electrode) 234 and the first electrode wiring layer 222 are made continuous by a first plug 226 embedded in the first contact hole 252. The second electrode (upper electrode) 236 and the second electrode wiring layer 224 are made continuous in the same manner by a second plug 228 embedded in the second contact hole 254.

When the interlayer insulation layer 250 is not present in this arrangement, during pattern etching of the first electrode (lower electrode) wiring layer 222 and the second electrode (upper electrode) wiring layer 224, the second barrier layer 244 of the reducing gas barrier layer 240 beneath is etched, and the barrier properties thereof are reduced. The interlayer insulation layer 250 is necessary in order to secure the barrier properties of the reducing gas barrier layer 240.

The interlayer insulation layer 250 preferably has a low hydrogen content. The interlayer insulation layer 250 is therefore degassed by annealing. The hydrogen content of the interlayer insulation layer 250 is thereby made lower than that of a passivation layer 260 for covering the first and second electrode wiring layers 222, 224.

Figure 5:
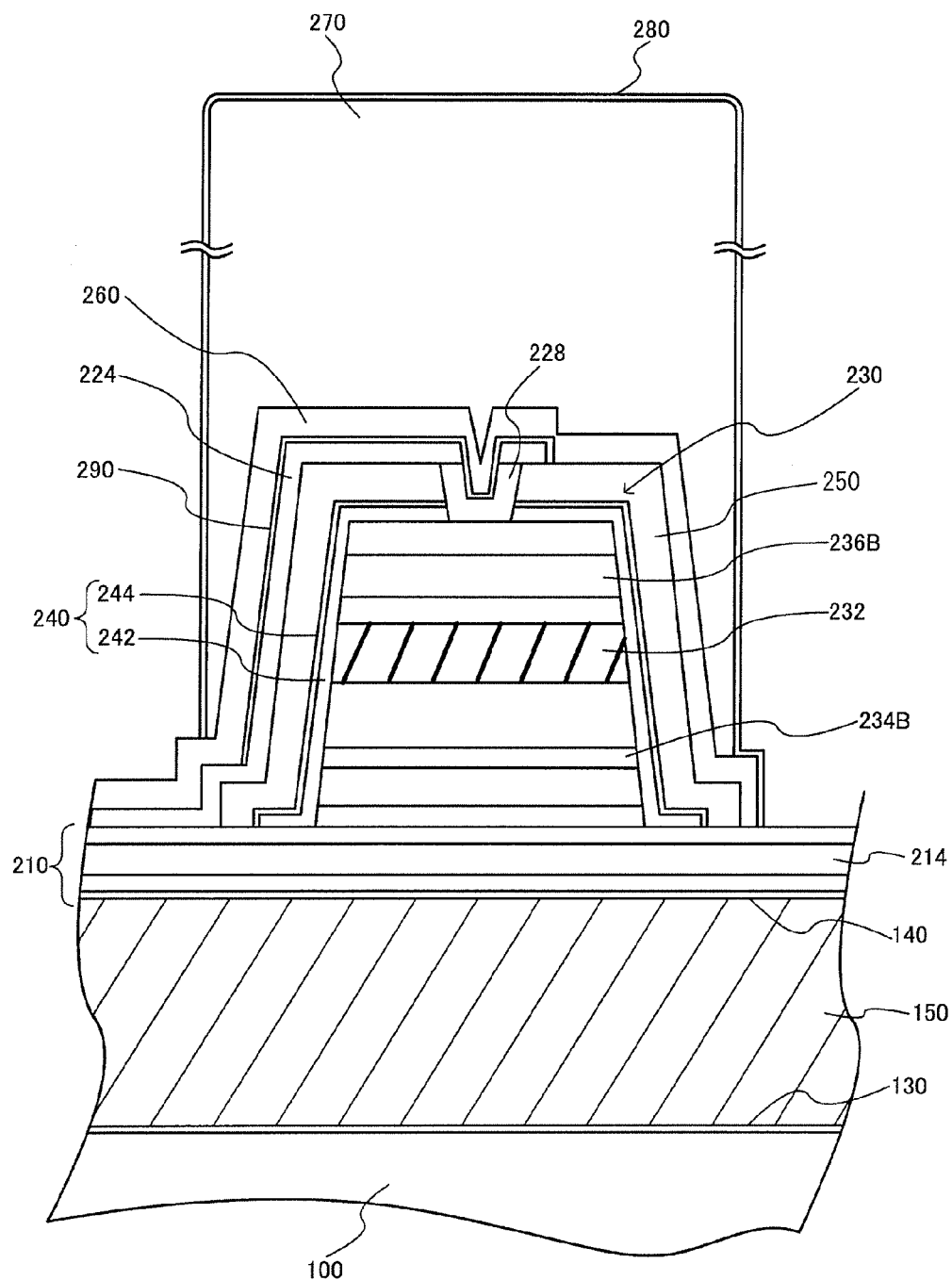
FIG. 5 is a simplified sectional view showing a modification in which the reducing gas barrier properties in the vicinity of the wiring plug are enhanced.

Since the reducing gas barrier layer 240 at the top of the capacitor 230 is devoid of contact holes and closed when the interlayer insulation layer 250 is formed, the reducing gas during formation of the interlayer insulation layer 250 does not penetrate into the capacitor 230. However, the barrier properties decline after the contact hole is formed in the reducing gas barrier layer 240. As an example of a technique for preventing this phenomenon, the first and second plugs 226, 228 are formed by a plurality of layers 228A, 228B (only the second plug 228 is shown in FIG. 4), as shown in FIG. 4, and a barrier metal layer is used in the first layer 228A. Reducing gas barrier properties are ensured by the barrier metal of the first layer 228A. Highly diffusible metals such as titanium Ti are not preferred as the barrier metal of the first layer 228A, and titanium aluminum nitride TiAlN, which has minimal diffusibility and high reducing gas barrier properties, can be used. A reducing gas barrier layer (third reducing gas barrier) 290 may be additionally provided so as to surround at least the second plug 228 as shown in FIG. 5, as a method for stopping the penetration of reducing gas from the contact hole. This reducing gas barrier layer 290 may also serve as the barrier metal 228A of the second plug 228, or the barrier metal 228A may be removed. The reducing gas barrier layer 290 may also coat the first plug 226. The reducing gas barrier layer 290 can be formed by forming a layer of aluminum oxide $Al_2O_3$, for example, having a thickness of 20 to 50 nm by Atomic Layer Chemical Vapor Deposition (ALCVD).

The $SiO_2$ or SiN passivation layer 260 is provided so as to cover the first and second electrode wiring layers 222, 224. An infrared-absorbing body (one example of a light-absorbing member) 270 is provided on the passivation layer 260 above at least the capacitor 230. The passivation layer 260 is also formed from $SiO_2$ or SiN, but is preferably formed from a different type of material which has a high etching selection ratio with respect to the passivation layer 260 below, due to the need for pattern etching of the infrared-absorbing body 270. Infrared rays are incident on the infrared-absorbing body 270 from the direction of the arrow in FIG. 2, and the infrared-absorbing body 270 evolves heat in accordance with the amount of infrared rays absorbed. This heat is transmitted to the pyroelectric body 232, whereby the amount of spontaneous polarization of the capacitor 230 varies according to the heat, and the infrared rays can be detected by detecting the charge due to the spontaneous polarization. The infrared-absorbing body 270 is not limited to being provided separately from the capacitor 230, and need not be provided separately in a case in which the infrared-absorbing body 270 is present within the capacitor 230 and the second plug 228 which is connected to the second lelctrode in FIG. 1.

Even when reducing gas is generated during CVD formation of the passivation layer 260 or the infrared-absorbing body 270, the capacitor 230 is protected by the reducing gas barrier layer 240 and the barrier metals in the first and second plugs 226, 228.

A reducing gas barrier layer is provided so as to cover the external surface of the pyroelectric infrared detector 200 which includes the infrared-absorbing body 270. The reducing gas barrier layer must be formed with a smaller thickness than the reducing gas barrier layer 240, for example, in order to increase the transmittance of infrared rays (in the wavelength spectrum of 8 to 14 μm) incident on the infrared-absorbing body 270. For this purpose, Atomic Layer Chemical Vapor Deposition (ALCVD) is used, which is capable of adjusting the layer thickness at a level corresponding to the size of an atom. The reason for this is that the layer formed by a common CVD method is too thick, and infrared transmittance is adversely affected. In the present embodiment, a layer is formed having a thickness of 10 to 50 nm, e.g., 20 nm, from aluminum oxide $Al_2O_3$, for example. As described above, Atomic Layer Chemical Vapor Deposition (ALCVD) has excellent embedding characteristics in comparison with sputtering and other methods, and is therefore adapted to miniaturization, a precise layer can be formed at the atomic level, and reducing gas barrier properties can be increased even in a thin layer.

On the side of the base part 100, a first etching stop layer 130 for use during isotropic etching of the sacrificial layer 150 (see FIG. 4) embedded in the cavity 102 in the process of manufacturing the pyroelectric infrared detector 200 is formed on a wall part for defining the cavity 102, i.e., a side wall 104A and a bottom wall 100A for defining the cavity. A second etching stop layer 140 is formed in the same manner on a lower surface (upper surface of the sacrificial layer 150) of the support member 210. In the present embodiment, the reducing gas barrier layer is formed from the same material as the first and second etching stop layers 130, 140. In other words, the first and second etching stop layers 130, 140 also have reducing gas barrier properties. The first and second etching stop layers 130, 140 are also formed by forming layers of aluminum oxide $Al_2O_3$ having a thickness of 20 to 50 nm by Atomic Layer Chemical Vapor Deposition (ALCVD). The first and second etching stop layers 130, 140 may thereby also have reducing gas barrier properties.

Since the second etching stop layer 140 has reducing gas barrier properties, when the sacrificial layer 150 is isotropically etched by hydrofluoric acid in a reductive atmosphere, it is possible to keep the reducing gas from passing through the support member 210 and penetrating into the capacitor 230. Since the first etching stop layer 130 for covering the base part 100 has reducing gas barrier properties, it is possible to keep the transistors or wiring of the circuit in the base part 100 from being reduced and degraded.

3. Characteristic Structure of the Pyroelectric Infrared Detector

3.1 Reducing gas Barrier Properties

The reducing gas barrier properties of the pyroelectric infrared detector 200 of the present embodiment will be described with reference to FIGS. 1 and 6. As described above, the characteristics of the pyroelectric infrared detector 200 are degraded when oxygen deficit occurs in the pyroelectric body 232 of the capacitor 230 due to reducing gas ($H_2$, OH groups, or the like). Therefore, since a sacrificial layer 150 is etched by an etchant having reducing properties, e.g., hydrofluoric acid or the like, in a step subsequent to completion of the support member 210 and the pyroelectric detection element 220, it is extremely important that reducing gas barrier properties be maintained in the pyroelectric detector 200.

The first reducing gas barrier layers will first be described. The first reducing gas barrier layers also serve as etching stop layers for preventing the support member 210 and pyroelectric infrared detection element 220 from being etched when the sacrificial layer 150 is isotropically etched.

As shown in FIG. 1, the first reducing gas barrier layers cover a first surface (back surface or lower surface) 211B of the support member 210, a side surface 211C of the support member 210 facing the opening part 102A, and an external surface 220A of the support member 210 and pyroelectric infrared detection element 220 exposed as viewed from the side of the pyroelectric infrared detection element 220 (from above in FIG. 1); i.e., the fully exposed surfaces of the support member 210 and the infrared detection element 220 that come in contact with the etchant are covered. The second and third etching stop layers 140, 280 lose the function thereof after etching, but in the present embodiment, the second and third etching stop layers 140, 280 remain without being removed after etching, and are made to function as first reducing gas barrier layers.

The reducing gas barrier layer of the first reducing gas barrier layers covers the first surface (back surface or lower surface) 211B of the support member 210, and therefore can block reductive obstructive factors from below the capacitor 230. An example of a reductive obstructive factor from below the capacitor 230 is hydrogen gas generated from the hydrofluoric acid used during isotropic etching of the sacrificial layer 150, or reductive degassing ($H_2$, OH groups, or the like) from the moisture content of the spacer layer ($SiO_2$) 120 below the support member 210 during high-temperature processing at 400° C. or higher, e.g., baking of the pyroelectric body 232 or degassing of the interlayer insulation layer 250, for example.

The reducing gas barrier layer of the first reducing gas barrier layers covers the capacitor 230 from above, and therefore can block reductive obstructive factors from above the capacitor 230 in FIGS. 3 and 5. An example of a reductive obstructive factor from above the capacitor 230 is hydrogen gas generated from the hydrofluoric acid used during isotropic etching of the sacrificial layer 150 in FIG. 5.

Next, in the present embodiment, the pyroelectric infrared element 200 includes the pyroelectric body 232 between the first electrode 234 and the second electrode 236, and includes the capacitor 230 in which the amount of polarization varies based on the amount of heat (temperature) due to incident light, and the infrared-absorbing body (one example of a light-absorbing member) 270 for absorbing infrared rays (one example of light) and converting the absorbed infrared rays into heat, the infrared-absorbing body 270 being disposed on the side of the external surface 220A of the infrared detection element 200, and the barrier layer of the first reducing gas barrier layers may be formed so as to cover the infrared-absorbing body 270, as shown in FIGS. 3 through 5.

Through this configuration, reductive obstructive factors from the side of the infrared-absorbing body 270 can be blocked by the reducing gas barrier layer. The reducing gas barrier layer may also serve as an etching stop layer for preventing the infrared-absorbing body 270 from being etched during etching of the sacrificial layer 150.

The capacitor 230 may be configured so that the first electrode 234 is mounted on the support member 210, the second plug 228 connected to the second electrode 236 is provided, and the infrared-absorbing body 270 is formed so as to cover the second plug 228, as shown in FIGS. 3 through 5.

In a case in which the infrared-absorbing body 270 is formed so as to cover the second plug 228, reductive obstructive factors penetrating from the second plug 228 can be blocked by the reducing gas barrier layer. Unlike the configuration shown in FIGS. 3 through 5, the infrared-absorbing body 270 may be formed so as to cover the first plug 226 as well. Through this configuration, reductive obstructive factors penetrating from the first plug 226 can be blocked by the reducing gas barrier layer. However, the infrared-absorbing body 270 is not limited to being formed so as to cover the plugs 226, 228, and the infrared-absorbing body 270 may also be adapted so as to be formed in overhanging fashion by a thin layer member in a so-called umbrella-type configuration. In this case as well, the umbrella-type infrared-absorbing member can be covered, but the reducing gas barrier layer can be made to function as only an etching stop layer for preventing the umbrella-type infrared-absorbing member from being etched during etching of the sacrificial layer 150.

Furthermore, a second reducing gas barrier layer 240 for coating at least a side surface of the capacitor 230 may be further provided in the present embodiment. In this instance, the reducing gas barrier layer that covers the external surface 220A of the pyroelectric infrared detection element 220 and the support member 210 among the first reducing gas barrier layers may be formed so as to have a layer thickness less than that of the second reducing gas barrier layer 240. Through this configuration, adverse effects on infrared transmission characteristics are reduced by reducing the thickness of the reducing gas barrier layer provided in the path of incidence of infrared rays.

In the present embodiment, the electrical insulation layer (interlayer insulation layer) 250 is provided for covering the second reducing gas barrier layer 240, as shown in FIGS. 3 through 5, and the electrical insulation layer 250 may be subjected to degassing treatment by annealing at a high temperature of 400° C. or higher. Through this configuration, it is possible to reduce the occurrence of a phenomenon whereby the electrical insulation layer 250 adjacent to the second reducing gas barrier layer 240 causes degassing. Since the release of gas from the electrical insulation layer is thereby reduced even when annealing is performed subsequent to the step of forming the electrical insulation layer 250, the barrier properties of the second reducing gas barrier layer 240 can be maintained.

In the present embodiment, the second plug 228 fills in a contact hole formed through the second reducing gas barrier layer 240 and the electrical insulation layer 250, and the second electrode wiring layer 224 formed on the electrical insulation layer 250 and connected to the second plug 228, and the third reducing gas barrier layer 290 formed on the electrical insulation layer and the electrode wiring layer 250 may be further provided, as shown in FIG. 5.

Through this configuration, even when a contact hole is formed in the second reducing gas barrier layer 240, and the barrier properties of the second reducing gas barrier layer 240 are lost, the passage route of reducing gas can be blocked by the third reducing gas barrier layer 290.

In the support member 210 of the present embodiment on which the capacitor 230 is mounted, since residual stress causes curvature to occur when a single layer is used, the support member 210 is formed by a plurality of layers, e.g., three layers, so that the stress that causes curvature is cancelled out by the residual stresses of both tension and compression, as shown in FIG. 4.

In order from the capacitor 230 side, a first layer member 212 is composed of an oxide layer (e.g., $SiO_2$), a second layer member 214 is composed of a nitride layer (e.g., $Si_3N_4$), and a third layer member 216 is composed of an oxide layer (e.g., $SiO_2$, the same as the first layer member 212). Since the oxide layers and the nitride layer are stressed in opposite directions, the stress which causes curvature in the support member can be cancelled out.

Since a nitride layer (e.g., $Si_3N_4$) has reducing gas barrier properties, the second layer member 214 of the support member 210 also functions to block reductive obstructive factors from penetrating from the side of the support member 210 to the pyroelectric body 232 of the capacitor 230.

Evaporation vapor sometimes forms inside the capacitor 230 in the baking step of the pyroelectric body 232 and during other high-temperature processing, but an escape route for this vapor is maintained by the first layer member 212 of the support member 210, as indicated by the arrow in FIG. 4. In other words, in order to allow evaporation vapor formed inside the capacitor 230 to escape, it is better to provide gas barrier properties to the second layer member 214 than to provide gas barrier properties to the first layer member 212.

The first and second electrodes 234, 236 adjacent to the pyroelectric body 232 of the capacitor 230 are each formed by laminate structures of a plurality of types of layers in the present embodiment, and the formation of one layer 234B, 236B of each as reducing gas barrier layers will be described hereinafter.

3.2 Combined Use of the First Reducing gas Barrier Layers as Etching Stop Layers The combined use of the first reducing gas barrier layers as etching stop layers will be described in the context of the main steps of manufacturing the pyroelectric infrared detector 200, with reference to FIGS. 7 through 11.

Figure 7:
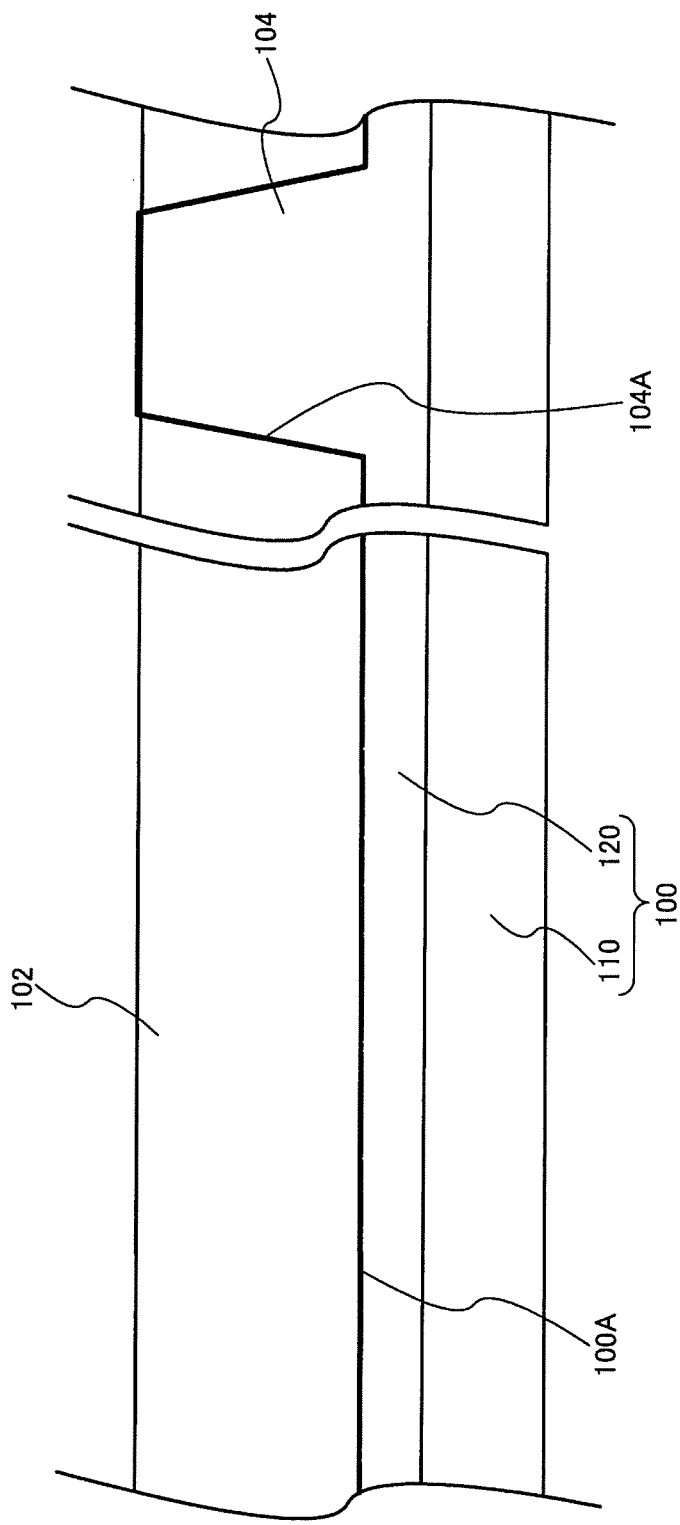
FIG. 7 is a simplified sectional view showing the step of forming the cavity and the first etching stop layer.

First, as shown in FIG. 7, the spacer layer ($SiO_2$) 120 formed on the silicon substrate 110 is etched to form the cavity 102 and the post 104. The first etching stop layer 130 is then formed on the wall portions which define the cavity 102, i.e., the side wall 104A of the post 104 and the bottom wall 100A for defining the cavity 102. The first etching stop layer 130 can be formed by forming a layer of aluminum oxide $Al_2O_3$ having a thickness of 20 to 50 nm by Atomic Layer Chemical Vapor Deposition (ALCVD).

Figure 8:
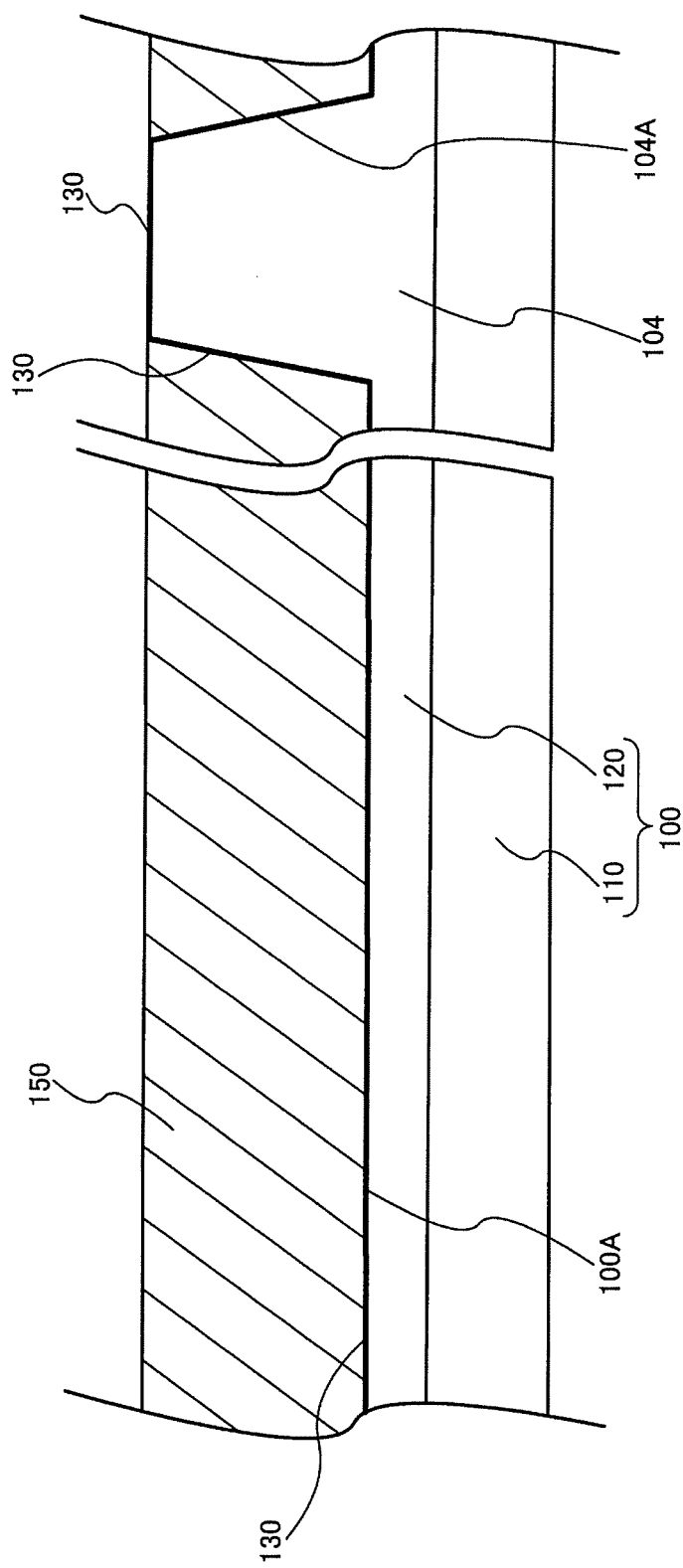
FIG. 8 is a simplified sectional view showing the step of forming the sacrificial layer.

The sacrificial layer 150 is then formed in the cavity 102 by depositing $SiO_2$, for example, by CVD, as shown in FIG. 8. The sacrificial layer 150 is flattened by CMP so as to be flush with the first etching stop layer 130 on the post 104.

Figure 9:
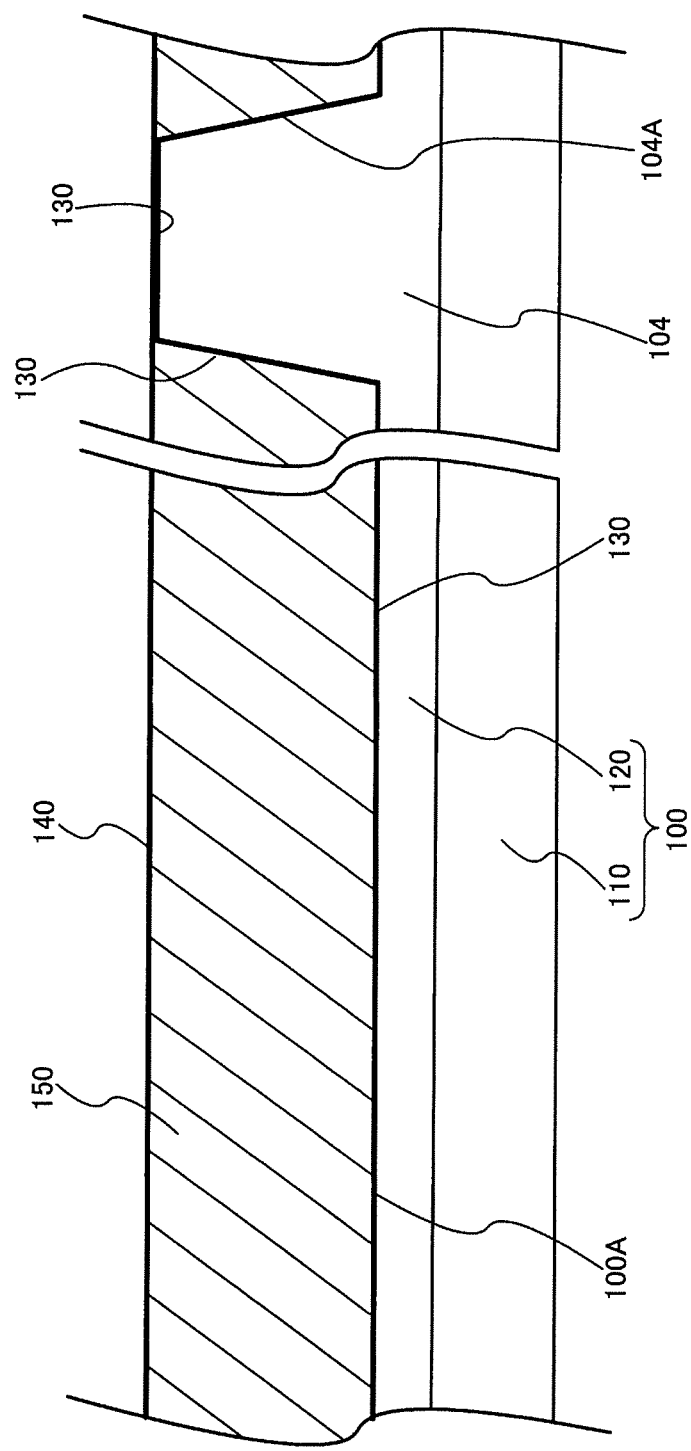
FIG. 9 is a simplified sectional view showing the step of forming the second etching stop layer.

The second etching stop layer 140 is then formed on the entire surface of the sacrificial layer 150 and the first etching stop layer 130 at the top surface of the post 104, as shown in FIG. 9. The second etching stop layer 140 is also formed by forming a layer of aluminum oxide $Al_2O_3$ having a thickness of 20 to 50 nm by Atomic Layer Chemical Vapor Deposition (ALCVD).

Figure 10:
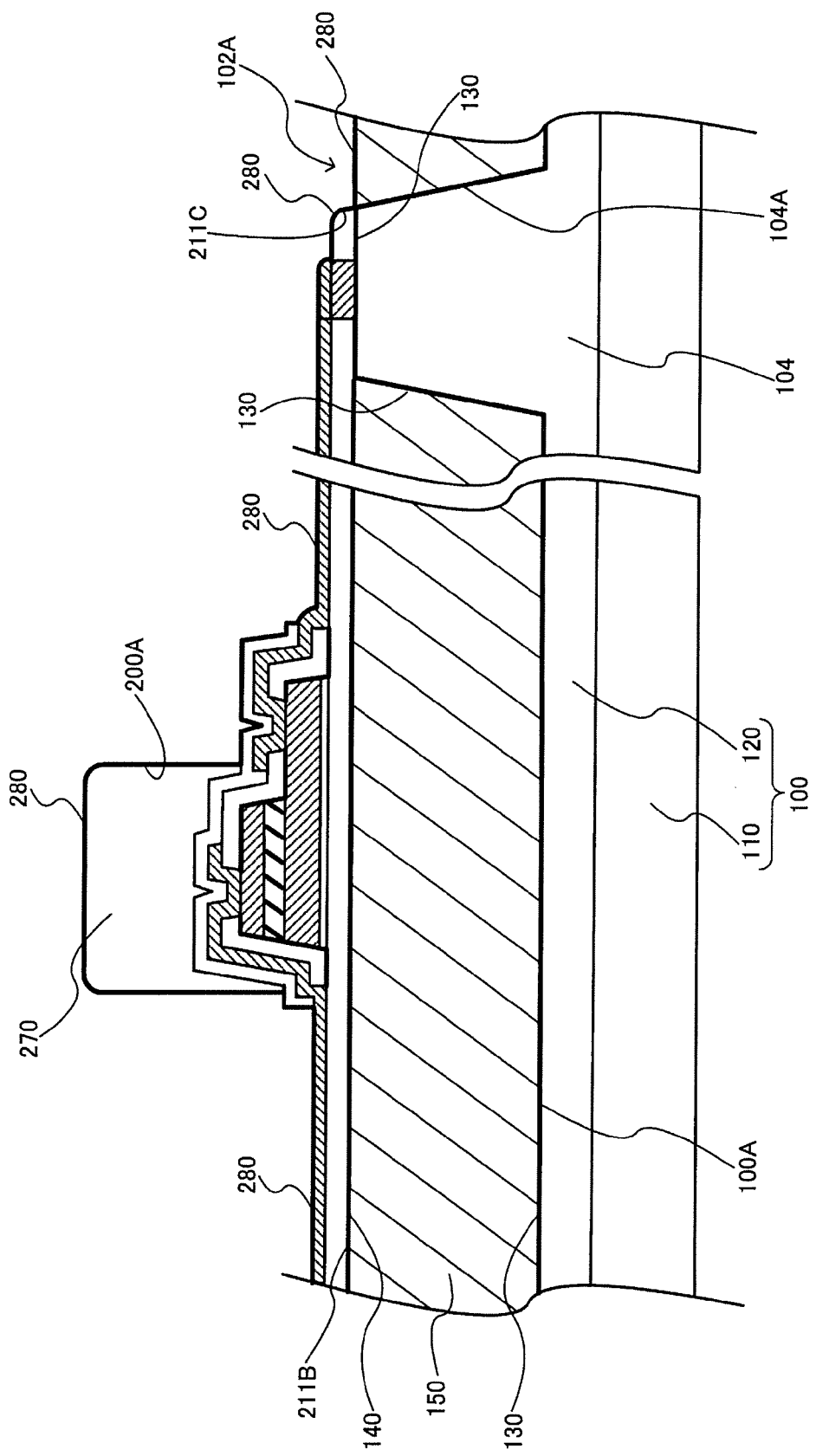
FIG. 10 is a simplified sectional view showing the step of forming the third etching stop layer.

The support member 210 is then formed on the entire surface of the second etching stop layer 140, and the infrared detection element 220 is formed on the support member 210, as shown in FIG. 10. For example, after the infrared-absorbing body 270 is formed, a resist material is applied to the entire surface thereof and exposed, the support member 210 formed on the entire surface of the sacrificial layer 150 is subsequently pattern-etched, and the opening parts 102A are formed along the outline of the support member 210 shown in FIG. 2. At this time, the second etching stop layer 140 in the opening parts 102A is removed, and the sacrificial layer 150 is exposed.

After the resist material is removed, the third etching stop layer 280 is formed on the entire surface, as shown in FIG. 10. The third etching stop layer 280 is formed by a thin layer having a thickness of about 20 nm, for example, by forming a layer of aluminum oxide $Al_2O_3$ by Atomic Layer Chemical Vapor Deposition (ALCVD).

At this time, the third etching stop layer 280 covers the side surface 211C of the support member 210 facing the opening parts 102A, and an external surface 200A of the support member 210 and the infrared detection element 220 exposed in plan view, and is also deposited so as to overlap the sacrificial layer 150 in the opening parts 102A.

Figure 11:
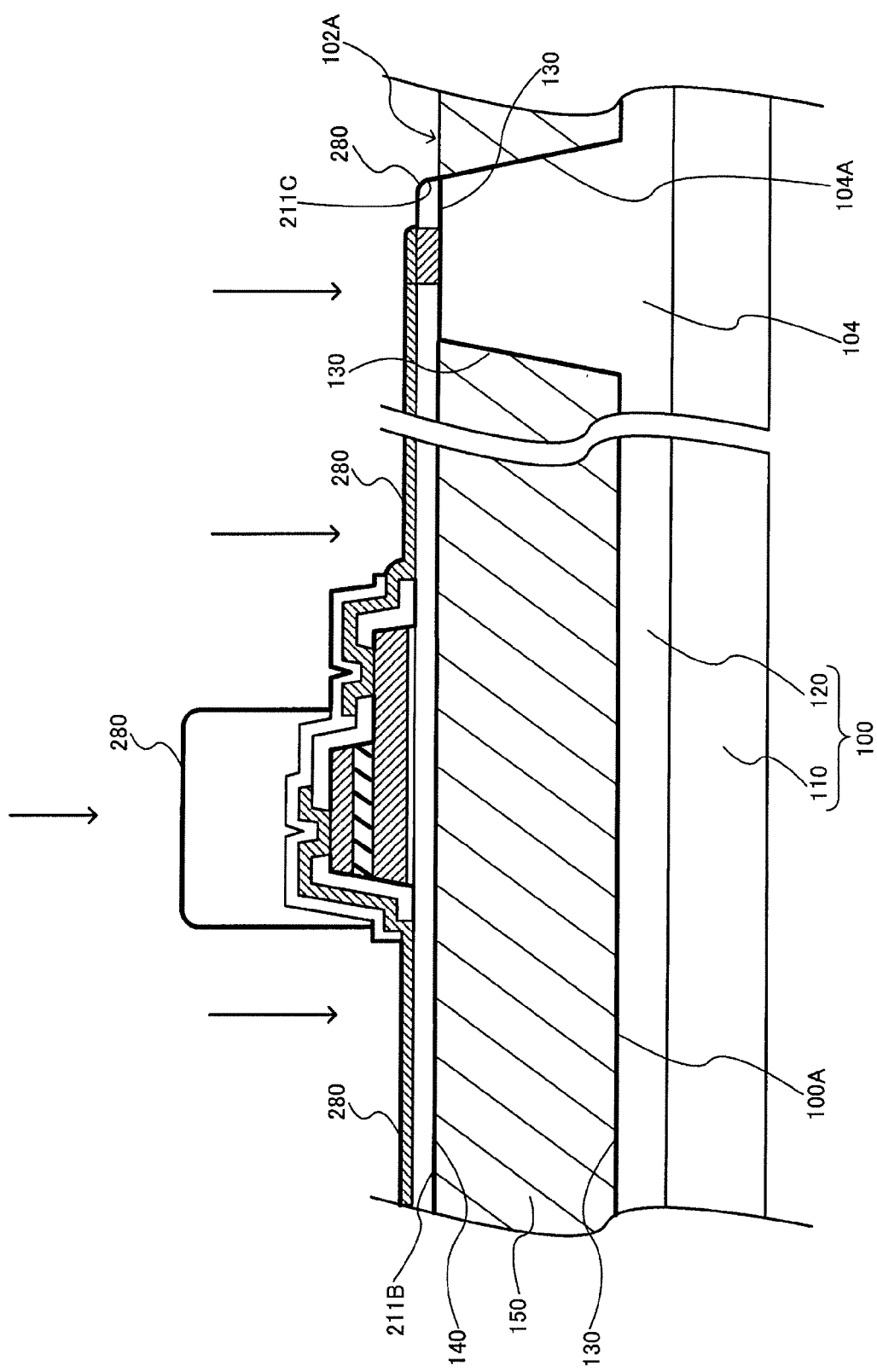
FIG. 11 is a simplified sectional view showing the step of isotropically etching the sacrificial layer.

The third etching stop layer 280 in the opening parts 102A is then removed by etching, and the sacrificial layer 150 is subsequently removed by isotropic etching with hydrofluoric acid or the like, as shown in FIG. 11. The etchant at this time penetrates from the opening parts 102A shown in FIGS. 2 and 11 and comes in contact with the sacrificial layer, and isotropic etching proceeds while the etchant flows around toward the back side (downward) of the support member 210. The sacrificial layer 150 is thereby removed, and the cavity 102 is formed, as shown in FIG. 1.

During this isotropic etching, the first etching stop layer 130, the second etching stop layer 140, and the third etching stop layer 280 protect the base part 100, the lower surface (first surface) 211 of the support member 210, and the external surface 200A of the support member 210 and the infrared detection element 220, respectively. At the same time, the second etching stop layer 140 and the third etching stop layer 280 can be made to function as first reducing gas barrier layers during the manufacturing steps which include etching of the sacrificial layer 150, as well as after completion of the finished product.

3.3 Thermal Conductance

Figure 6:
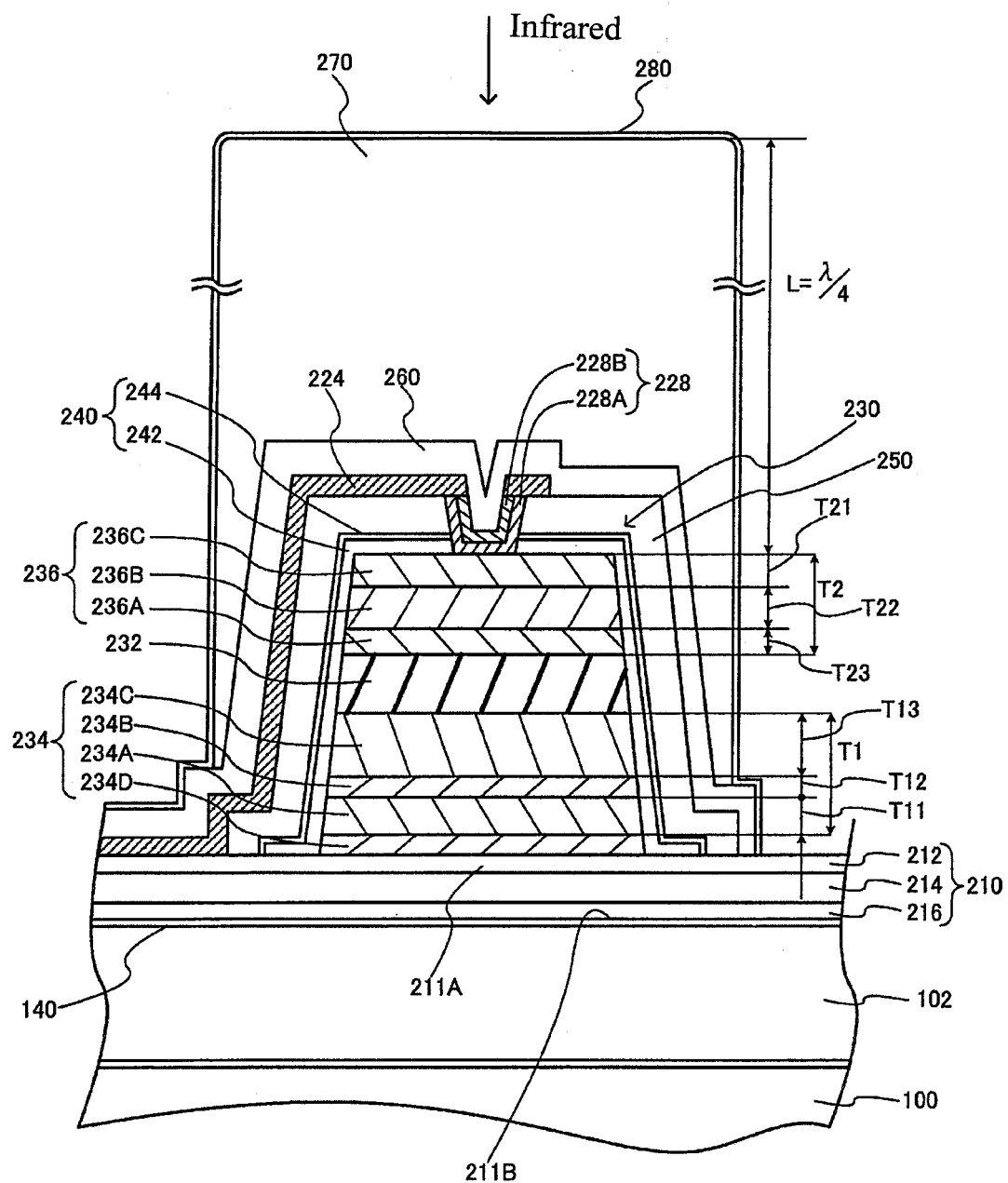
FIG. 6 is a simplified sectional view showing the capacitor structure of the pyroelectric infrared detector according to an embodiment of the present invention.

FIG. 6 is a simplified sectional view showing the structure of the capacitor 230 of the present embodiment in further detail. As described above, the capacitor 230 includes a pyroelectric body 232 between the first electrode (lower electrode) 234 and the second electrode (upper electrode) 236. The capacitor 230 is mounted and supported on a second surface or second side (lower surface or lower side in FIGS. 1, 3, and 6) 211A which faces a first surface or first side (upper surface or upper side in FIGS. 1, 3, and 6) 211B at which the support member 210 faces the cavity 102. Infrared rays can be detected by utilizing a change (pyroelectric effect or pyroelectronic effect) in the amount of spontaneous polarization of the pyroelectric body 232 according to the light intensity (temperature) of the incident infrared rays. In the present embodiment, the incident infrared rays are absorbed by the infrared-absorbing body 270, heat is evolved by the infrared-absorbing body 270, and the heat evolved by the infrared-absorbing body 270 is transmitted via a solid heat transfer path between the infrared-absorbing body 270 and the pyroelectric body 232.

In the capacitor 230 of the present embodiment, the thermal conductance G1 of the first electrode (lower electrode) 234 adjacent to the support member 210 is less than the thermal conductance G2 of the second electrode (upper electrode) 236. Through this configuration, the heat caused by the infrared rays is readily transmitted to the pyroelectric body 232 via the second electrode (upper electrode) 236, the heat of the pyroelectric body 232 does not readily escape to the support member 210 via the first electrode (lower electrode) 234, and the signal sensitivity of the infrared detection element 220 is enhanced.

The structure of the capacitor 230 having the characteristics described above will be described in further detail with reference to FIG. 6. First, the thickness T1 of the first electrode (lower electrode) 234 is greater than that of the second electrode (upper electrode) 236 (T1>T2). The thermal conductance G1 of the first electrode (lower electrode) 234 is such that $G1=\lambda 1/T1$, where $\lambda 1$ is the thermal conductivity of the first electrode (lower electrode) 234. The thermal conductance G2 of the second electrode (upper electrode) 236 is such that $G2=\lambda 2/T2$, where 12 is the thermal conductance of the second electrode (upper electrode) 236.

In order to obtain a thermal conductance relationship of G1<G2, when the first and second electrodes 234, 236 are both formed from the same single material, such as platinum Pt or iridium Ir, then A1=A2, and T1>T2 from FIG. 6. The relationship G1<G2 can therefore be satisfied.

A case in which the first and second electrodes 234, 236 are each formed from the same material will first be considered. In the capacitor 0230, in order for the crystal direction of the pyroelectric body 232 to be aligned, it is necessary to align the crystal lattice level of the boundary of the lower layer on which the pyroelectric body 232 is formed with the first electrode 234. In other words, although the first electrode 234 has the function of a crystal seed layer, platinum Pt has strong self-orienting properties and is therefore preferred as the first electrode 234. Iridium Ir is also suitable as a seed layer material.

In the second electrode (upper electrode) 236, the crystal orientations are preferably continuously related from the first electrode 234 through the pyroelectric body 232 and the second electrode 236, without breaking down the crystal properties of the pyroelectric body 232. The second electrode 236 is therefore preferably formed from the same material as the first electrode 234.

When the second electrode 236 is thus formed by the same material, e.g., Pt, Ir, or another metal, as the first electrode 234, the upper surface of the second electrode 236 can be used as a reflective surface. In this case, as shown in FIG. 6, the distance L from the top surface of the infrared-absorbing body 270 to the top surface of the second electrode 236 is preferably λ/4 (where % is the detection wavelength of infrared rays). Through this configuration, multiple reflection of infrared rays of the detection wavelength λ occurs between the top surface of the infrared-absorbing body 270 and the top surface of the second electrode 236, and infrared rays of the detection wavelength 2 can therefore be efficiently absorbed by the infrared-absorbing body 270.

3.4 Electrode Multilayer Structure

The structure of the capacitor 230 of the present embodiment shown in FIG. 6 will next be described. In the capacitor 230 shown in FIG. 6, the preferred orientation directions of the pyroelectric body 232, the first electrode 234, and the second electrode 236 are aligned with the (111) plane direction, for example. Through a preferred orientation in the (111) plane direction, the orientation rate of (111) orientation with respect to other plane directions is controlled to 90% or higher, for example. The (100) orientation or other orientation is more preferred than the (111) orientation in order to increase the pyroelectric coefficient, but the (111) orientation is used so as to make polarization easy to control with respect to the applied field direction. However, the preferred orientation direction is not limited to this configuration.

The first electrode 234 may include, in order from the support member 210, an orientation control layer (e.g., Ir) 234A for controlling the orientation so as to give the first electrode 234 a preferred orientation in the (111) plane, for example, a first reducing gas barrier layer (e.g., IrOx) 234B, and a preferentially-oriented seed layer (e.g., Pt) 234C.

The second electrode 236 may include, in order from the pyroelectric body 232, an orientation alignment layer (e.g., Pt) 236A in which the crystal alignment is aligned with the pyroelectric body 232, a second reducing gas barrier layer (e.g., IrOx) 236B, and a resistance-lowering layer (e.g., Ir) 236C for lowering the resistance of the bonded surface with the second plug 228 connected to the second electrode 236.

The first and second electrodes 234, 236 of the capacitor 230 are provided with a multilayer structure in the present embodiment so that the pyroelectric infrared detection element 220 is processed with minimal damage and without reducing the capability thereof despite the small heat capacity thereof, the crystal lattice levels are aligned at each boundary, and the pyroelectric body (oxide) 232 is isolated from reducing gas even when the periphery of the capacitor 230 is exposed to a reductive atmosphere during manufacturing or use.

The pyroelectric body 232 is formed by growing a crystal of PZT (lead zirconate titanate: generic name for Pb(Zr, Ti)O$_3$), PZTN (generic name for the substance obtained by adding Nb to PZT), or the like with a preferred orientation in the (111) plane direction, for example. The use of PZTN is preferred, because even a thin layer is not readily reduced, and oxygen deficit can be suppressed. In order to obtain directional crystallization of the pyroelectric body 232, directional crystallization is performed from the stage of forming the first electrode 234 as the layer under the pyroelectric body 232.

The Ir layer 234A for functioning as an orientation control layer is therefore formed on the lower electrode 234 by sputtering. A titanium aluminum nitride (TiAlOX) layer or a titanium nitride (TiN) layer, for example, as the adhesive layer 234D may also be formed under the orientation control layer 234A, as shown in FIG. 6. The reason for this is that adhesion may be difficult to maintain, depending on the material of the support member 210. When the first layer member 212 of the support member 210 positioned beneath the adhesive layer 234D is formed from SiO$_2$, the first layer member 212 is preferably formed by an amorphous material or a material having smaller grains than polysilicon. The smoothness of the surface of the support member 210 on which the capacitor 230 is mounted can thereby be maintained. When the surface on which the orientation control layer 234A is formed is rough, the irregularities of the rough surface are reflected in the growth of the crystal, and a rough surface is therefore not preferred.

In order to isolate the pyroelectric body 232 from reductive obstructive factors from below the capacitor 230, the IrOx layer 234B for functioning as a reducing gas barrier layer in the first electrode 234 is used together with the second layer member (e.g., Si$_3$N$_4$) 214 of the support member 210, and the second etching stop layer (e.g., Al$_2$O$_3$) 140 of the support member 210, which exhibit reducing gas barrier properties. The reducing gas used in degassing from the base part 100 during baking or other annealing steps of the pyroelectric body (ceramic) 232, or in the isotropic etching step of the sacrificial layer 150, for example, is a reductive obstructive factor.

The IrOx layer 234B as such has minimal crystallinity, but the IrOx layer 234B is in a metal-metal oxide relationship with the Ir layer 234A and thus has good compatibility therewith, and can therefore have the same preferred orientation direction as the Ir layer 234A.

The Pt layer 234C for functioning as a seed layer in the first electrode 234 is a seed layer for the preferred orientation of the pyroelectric body 232, and has the (111) orientation. In the present embodiment, the Pt layer 234C has a two-layer structure. The first Pt layer forms the basis of the (111) orientation, microroughness is formed on the surface by the second Pt layer, and the Pt layer 234C thereby functions as a seed layer for preferred orientation of the pyroelectric body 232. The pyroelectric body 232 is in the (111) orientation after the fashion of the seed layer 234C.

In the second electrode 236, since the boundaries of sputtered layers are physically rough, trap sites occur, and there is a risk of degraded characteristics, the lattice alignment is reconstructed on the crystal level so that the crystal orientations of the first electrode 234, the pyroelectric body 232, and the second electrode 236 are continuously related.

The Pt layer 236A in the second electrode 236 is formed by sputtering, but the crystal direction of the boundary immediately after sputtering is not continuous. Therefore, an annealing process is subsequently performed to re-crystallize the Pt layer 236A. In other words, the Pt layer 236A functions as an orientation alignment layer in which the crystal orientation is aligned with the pyroelectric body 232.

The IrOx layer 236B in the second electrode 236 functions as a barrier for reductive obstructive factors from above the capacitor 230. Since the IrOx layer 236B has a high resistance value, the Ir layer 236C in the second electrode 236 is used to lower the resistance value with respect to the second plug 228. The Ir layer 236C is in a metal oxide-metal relationship with the IrOx layer 236B and thus has good compatibility therewith, and can therefore have the same preferred orientation direction as the IrOx layer 236B.

In the present embodiment, the first and second electrodes 234, 236 thus have multiple layers arranged in the sequence Pt, IrOx, Ir from the pyroelectric body 232, and the materials forming the first and second electrodes 234, 236 are arranged symmetrically about the pyroelectric body 232.

However, the thicknesses of each layer of the multilayer structures forming the first and second electrodes 234, 236 are asymmetrical about the pyroelectric body 232. The total thickness T1 of the first electrode 234 and the total thickness T2 of the second electrode 236 satisfy the relationship (T1>T2) as also described above. The thermal conductivities of the Ir layer 234A, IrOx layer 234B, and Pt layer 234C of the first electrode 234 are designated as λ1, λ2, and λ3, respectively, and the thicknesses thereof are designated as T11, T12, and T13, respectively. The thermal conductivities of the Ir layer 236C, IrOx layer 236B, and Pt layer 236A of the second electrode 236 are also designated as λ1, λ2, and λ3, respectively, and the thicknesses thereof are designated as T21, T22, and T23, respectively.

When the thermal conductances of the Ir layer 234A, IrOx layer 234B, and Pt layer 234C of the first electrode 234 are designated as G11, G12, and G13, respectively, G11=λ1/T11, G12=λ2/T12, and G13=λ3/T13. When the thermal conductances of the Ir layer 236C, IrOx layer 236B, and Pt layer 236A of the second electrode 236 are designated as G21, G22, and G23, respectively, G21=λ1/T21, G22=λ2/T22, and G23=λ3/T23.

Since 1/G1=(1/G11)+(1/G12)+(1/G13), the total thermal conductance G1 of the first electrode 234 is expressed by the equation (1) below.

$$G1=(G11\times G12\times G13)/(G11\times G12+G12\times G13+G11\times G13) \quad (1)$$

In the same manner, since 1/G2=(1/G21)+(1/G22)+(1/G23), the total thermal conductance G2 of the second electrode 236 is expressed by the equation (2) below.

$$G232\ (G21\times G22\times G23)/(G21\times G2+G22\times G23+G21\times G23) \quad (2)$$

The thicknesses of each layer of the multilayer structure s forming the first and second electrodes 234, 236 are substantially in the relationships described below under conditions that satisfy T11+T12+T13=T1>T2=T21+T22+T23.

Ir layers 234A, 236C T11:T21=1:0.7
IrOx layers 234B, 236B T12:T22=0.3:1
Pt layers 234C, 236A T13:T231=3:1

The reasons for adopting such layer thickness relationships are as follows. First, regarding the Ir layers 234A, 236C, since the Ir layer 234A in the first electrode 234 functions as an orientation control layer, a predetermined layer thickness is necessary in order to impart orientation properties, whereas the purpose of the Ir layer 236C of the second electrode 236 is to lower resistance, and lower resistance can be obtained the thinner the layer is.

Next, regarding the IrOx layers 234B, 236B, barrier properties against reductive obstructive factors from below and above the capacitor 230 are obtained by joint use of other barrier layers (the second layer member 214, the reducing gas barrier layer 240, and the second etching stop layers 140/reducing gas barrier layers), and the IrOx layer 234B of the first electrode 234 is formed having a small thickness, but the thickness of the IrOx layer 236B of the second electrode is increased to compensate for low barrier properties in the second plug 228.

Lastly, regarding the Pt layers 234C, 236A, the Pt layer 234C in the first electrode 234 functions as a seed layer for determining the preferred orientation of the pyroelectric body 232, and therefore must have a predetermined layer thickness, whereas the purpose of the Pt layer 236A of the second electrode 236 is to function as an orientation alignment layer aligned with the orientation of the pyroelectric body 232, and the Pt layer 236A may therefore be formed with a smaller thickness than the Pt layer 234C in the first electrode 234.

The thickness ratio of the Ir layer 234A, IrOx layer 234B, and Pt layer 234C of the first electrode 234 is set so that T11:T12:T13=10:3:15, for example, and the thickness ratio of the Ir layer 236C, IrOx layer 236B, and Pt layer 236A of the second electrode 236 is set so that T21:T22:T23=7:10:5, for example.

The thermal conductivity λ3 of Pt is equal to 71.6 (W/m·K), and the thermal conductivity λ1 of Ir is equal to 147 (W/m·K), which is substantially twice the thermal conductivity λ3 of Pt. The thermal conductivity λ2 of IrOx varies according to the temperature or the oxygen/metal ratio (O/M), but does not exceed the thermal conductivity λ1 of Ir. When the layer thickness relationships and thermal conductivity relationships described above are substituted into Equations (1) and (2) to calculate the size relationship between G1 and G2, it is apparent that G1<G2. Thus, even when the first and second electrodes 234, 236 are endowed with a multilayer structure as in the present embodiment, the expression G1<G2 is satisfied from the relationship of the thermal conductivities and layer thicknesses.

When the first electrode 234 has the adhesive layer 234D on the bonded surface with the support member 210 as described above, the thermal conductance G1 of the first electrode 234 is reduced, and the relationship G1<G2 is easily satisfied.

Since the etching mask of the capacitor 230 degrades as etching proceeds, the side walls of the capacitor 230 acquire a tapered shape which is narrower at the top and wider at the bottom as shown in FIG. 6, the more layers are added to the structure. However, since the taper angle with respect to the horizontal surface is about 80 degrees, considering that the total height of the capacitor 230 is on the order of nanometers, the increase in surface area of the first electrode 234 with respect to the second electrode 236 is small. The amount of heat transferred by the first electrode 234 can thereby be kept smaller than the amount of heat transferred by the second electrode 236, based on the relationship between the thermal conductance values of the first and second electrodes 234, 236.

3.5 Modifications of the Capacitor Structure

A single-layer structure and multilayer structure are described above for the first and second electrodes 234, 236 of the capacitor 230, but various other combinations of structures are possible which produce the thermal conductance relationship G1<G2 while maintaining the function of the capacitor 230.

First, the Ir layer 236C of the second electrode 236 may be omitted. The reason for this is that in this case, the object of lowering resistance is achieved in the same manner when Ir, for example, is used as the material of the second plug 228. Through this configuration, since the thermal conductance G2 of the second electrode 236 is greater than in the case shown in FIG. 6, the relationship G1<G2 is easily satisfied. A reflective surface for defining L=λ/4 shown in FIG. 6 takes the place of the Pt layer 236A of the second electrode 236 in this case, but a multiple reflection surface can be maintained in the same manner.

Next, the thickness of the IrOx layer 236B in the second electrode 236 in FIG. 6 may be made equal to or less than the thickness of the IrOx layer 234B in the first electrode 234. As described above, since the barrier properties against reductive obstructive factors from below and above the capacitor 230 are obtained by joint use of other barrier layers (the second layer member 214, the reducing gas barrier layer 240, and the second etching stop layers 140/reducing gas barrier layers), when the reducing gas barrier properties in the second plug 228 are increased by the configuration shown in FIG. 5, for example, there is no need for the thickness of the IrOx layer 236B in the second electrode 236 to be greater than the thickness of the IrOx layer 234B in the first electrode 234. Through this configuration, the thermal conductance G2 of the second electrode 236 further increases, and the relationship G1<G2 is easier to obtain.

Next, the IrOx layer 234B in the first electrode 234 shown in FIG. 6 may be omitted. Crystal continuity between the Ir layer 234A and the Pt layer 234C is not hindered by omission of the IrOx layer 234B, and no problems occur with regard to crystal orientation. When the IrOx layer 234B is omitted, the capacitor 230 has no barrier layer with respect to reductive obstructive factors from below the capacitor 230. However, the second layer member 214 is present in the support member 210 for supporting the capacitor 230, and the second etching stop layer 140 is present on the lower surface of the support member 210, and when the second layer member 214 and the etching stop layer 140 are formed by layers having reducing gas barrier properties, barrier properties with respect to reductive obstructive factors from below the capacitor 230 can be maintained in the capacitor 230.

When the IrOx layer 234B in the first electrode 234 is omitted in this arrangement, the thermal conductance G1 of the first electrode 234 increases. It may therefore be necessary to increase the thermal conductance G2 of the second electrode 236 as well in order to obtain the relationship G1<G2. In this case, the IrOx layer 236B in the second electrode 236 may be omitted, for example. Once the IrOx layer 236B is omitted, the Ir layer 236C is also no longer necessary. The reason for this is that the Pt layer 236A functions as a resistance-lowering layer instead of the Ir layer 236C. Barrier properties with respect to reductive obstructive factors from above the capacitor 230 can be maintained by the reducing gas barrier layer 240 described above, the barrier metal 228A shown in FIG. 4, or the reducing gas barrier layer 290 shown in FIG. 5.

When the second electrode 236 shown in FIG. 6 is formed only by the Pt layer 236A as described above, the first electrode 234 may be formed by the Pt layer 234C as a single layer, by the Ir layer 234A and Pt layer 234C as two layers, or by the Ir layer 234A of FIG. 6, the IrOx layer 234B, and the Pt layer 234C as three layers. In any of these cases, the relationship G1<G2 can easily be obtained by making the thickness T11 of the Ir layer 234A of the first electrode 234 greater than the thickness T21 of the Pt layer 236A of the second electrode 236 (T11>T21), for example.

4. Electronic Instrument

Figure 12:
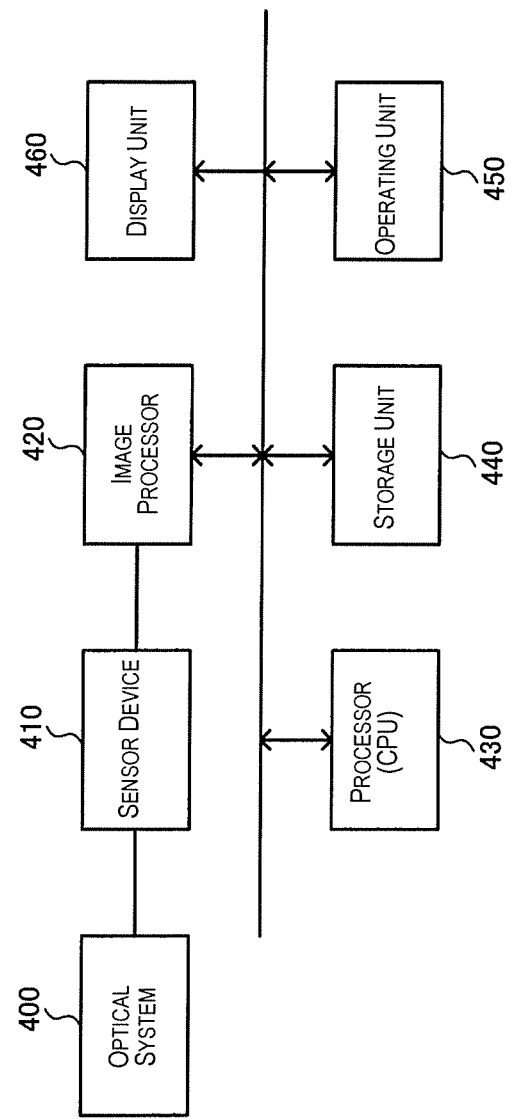
FIG. 12 is a block diagram showing the electronic instrument which includes the pyroelectric detector or pyroelectric detection device.

FIG. 12 shows an example of the configuration of an electronic instrument which includes the pyroelectric detector or pyroelectric detection device of the present embodiment. The electronic instrument includes an optical system 400, a sensor device (pyroelectric detection device) 410, an image processor 420, a processor 430, a storage unit 440, an operating unit 450, and a display unit 460. The electronic instrument of the present embodiment is not limited to the configuration shown in FIG. 12, and various modifications thereof are possible, such as omitting some constituent elements (e.g., the optical system, operating unit, display unit, or other components) or adding other constituent elements.

The optical system 400 includes one or more lenses, for example, a drive unit for driving the lenses, and other components. Such operations as forming an image of an object on the sensor device 410 are also performed. Focusing and other adjustments are also performed as needed.

The sensor device 410 is formed by arranging the pyroelectric detector 200 of the present embodiment described above in two dimensions, and a plurality of row lines (word lines, scan lines) and a plurality of column lines (data lines) are provided. In addition to the optical detector arranged in two dimensions, the sensor device 410 may also include a row selection circuit (row driver), a read circuit for reading data from the optical detector via the column lines, an A/D conversion unit, and other components. Image processing of an object image can be performed by sequentially reading data from optical detectors arranged in two dimensions.

The image processor 420 performs image correction processing and various other types of image processing based on digital image data (pixel data) from the sensor device 410.

The processor 430 controls the electronic instrument as a whole and controls each block within the electronic instrument. The processor 430 is realized by a CPU or the like, for example. The storage unit 440 stores various types of information and functions as a work area for the processor 430 or the image processor 420, for example. The operating unit 450 serves as an interface for operation of the electronic instrument by a user, and is realized by various buttons, a GUI (graphical user interface) screen, or the like, for example. The display unit 460 displays the image acquired by the sensor device 410, the GUI screen, and other images, for example, and is realized by a liquid crystal display, an organic EL display, or another type of display.

A pyroelectric detector of one cell may thus be used as an infrared sensor or other sensor, or the pyroelectric detector of one cell may be arranged along orthogonal axes in two dimensions to form the sensor device 410, in which case a heat (light) distribution image can be provided. This sensor device 410 can be used to form an electronic instrument for thermography, automobile navigation, a surveillance camera, or another application.

As shall be apparent, by using one cell or a plurality of cells of pyroelectric detectors as a sensor, it is possible to form an object analysis instrument (measurement instrument) for analyzing (measuring) physical information of an object, a security instrument for detecting fire or heat, an FA (factory automation) instrument provided in a factory or the like, and various other electronic instruments.

Figure 13A:
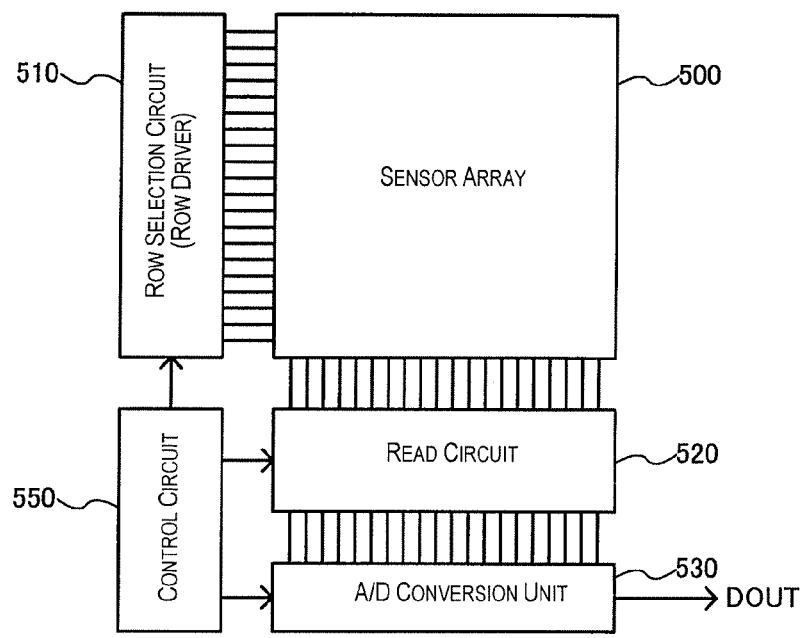
FIGS. 13A and 13B are views showing an example of the configuration of a pyroelectric detection device in which pyroelectric detectors are arranged in two dimensions.

FIG. 13A shows an example of the configuration of the sensor device 410 shown in FIG. 12. This sensor device includes a sensor array 500, a row selection circuit (row driver) 510, and a read circuit 520. An A/D conversion unit 530 and a control circuit 550 may also be included. An infrared camera or the like used in a night vision instrument or the like, for example, can be realized through the use of the sensor device described above.

A plurality of sensor cells is arrayed (arranged) along two axes as shown in FIG. 2, for example, in the sensor array 500. A plurality of row lines (word lines, scan lines) and a plurality of column lines (data lines) are also provided. The number of either the row lines or the column lines may be one. In a case in which there is one row line, for example, a plurality of sensor cells is arrayed in the direction (transverse direction) of the row line in FIG. 13A. In a case in which there is one column line, a plurality of sensor cells is arrayed in the direction (longitudinal direction) of the column line.

Figure 13B:
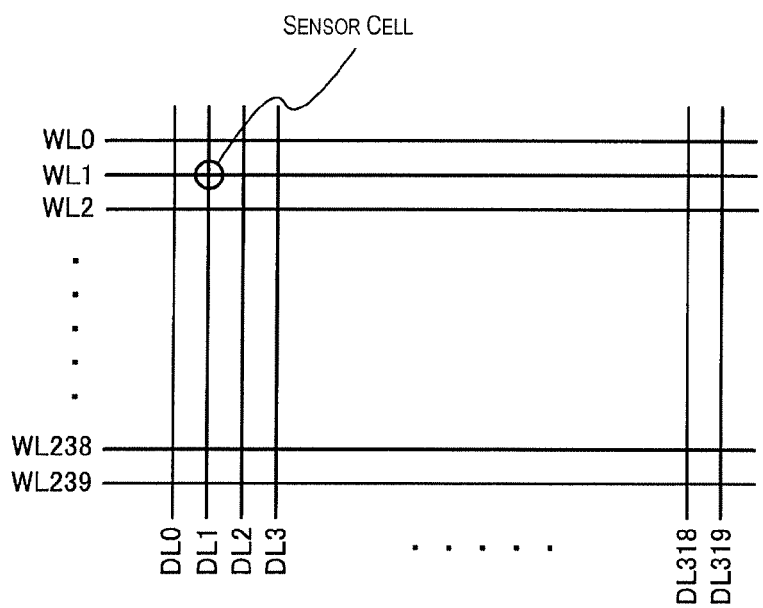

As shown in FIG. 13B, the sensor cells of the sensor array 500 are arranged (formed) in locations corresponding to the intersection positions of the row lines and the column lines. For example, a sensor cell in FIG. 13B is disposed at a location corresponding to the intersection position of word line WL1 and column line DL1. Other sensor cells are arranged in the same manner. The row selection circuit 510 is connected to one or more row lines, and selects each row line. Using a QVGA (320×240 pixels) sensor array 500 (focal plane array) such as the one shown in FIG. 13B as an example, an operation is performed for sequentially selecting (scanning) the word lines WL0, WL1, WL2, . . . WL239. In other words, signals (word selection signals) for selecting these word lines are outputted to the sensor array 500.

The read circuit 520 is connected to one or more column lines, and reads each column line. Using the QVGA sensor array 500 as an example, an operation is performed for reading detection signals (detection currents, detection charges) from the column lines DL0, DL1, DL2, . . . DL319.

The A/D conversion unit 530 performs processing for A/D conversion of detection voltages (measurement voltages, attained voltages) acquired in the read circuit 520 into digital data. The A/D conversion unit 530 then outputs the A/D converted digital data DOUT. Specifically, the A/D conversion unit 530 is provided with A/D converters corresponding to each of the plurality of column lines. Each A/D converter performs A/D conversion processing of the detection voltage acquired by the read circuit 520 in the corresponding column line. A configuration may be adopted in which a single A/D converter is provided so as to correspond to a plurality of column lines, and the single A/D converter is used in time division for A/D conversion of the detection voltages of a plurality of column lines.

The control circuit 550 (timing generation circuit) generates various control signals and outputs the control signals to the row selection circuit 510, the read circuit 520, and the A/D conversion unit 530. A control signal for charging or discharging (reset), for example, is generated and outputted. Alternatively, a signal for controlling the timing of each circuit is generated and outputted.

Several embodiments are described above, but it will be readily apparent to those skilled in the art that numerous modifications can be made herein without substantively departing from the new matter and effects of the present invention. All such modifications are thus included in the scope of the present invention. For example, in the specification or drawings, terms which appear at least once together with different terms that are broader or equivalent in meaning may be replaced with the different terms in any part of the specification or drawings.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A pyroelectric detector comprising:
a pyroelectric detection element;
a support member including a first side and a second side opposite from the first side, with the first side facing a cavity and the pyroelectric detection element being mounted and supported on the second side, an opening part extending to the cavity being formed on a periphery of the support member in a top plan view from the second side of the support member;
a fixing part supporting the support member; and
a first reducing gas barrier layer covering a first surface of the support member on the first side, a side surface of the support member facing the opening part, a part of a second surface of the support member on the second side, and the pyroelectric detection element exposed as viewed from the second side of the support member.

2. The pyroelectric detector according to claim 1, wherein the pyroelectric detection element includes
a capacitor including a pyroelectric body between a first electrode and a second electrode such that an amount of polarization is varied based on a temperature, and
a light-absorbing member configured to absorb light and to convert the light to heat, the light-absorbing member being disposed towards an external side of the pyroelectric detection element, and
the first reducing gas barrier layer covers the light-absorbing member.

3. The pyroelectric detector according to claim 2, wherein
the first electrode of the capacitor is disposed on the support member,
the capacitor includes a plug connected to the second electrode, and
the light-absorbing member covers the plug.

4. The pyroelectric detector according to claim 3, further comprising
a second reducing gas barrier layer coating at least a side surface of the capacitor,
a layer thickness of a part of the first reducing gas barrier layer covering the part of the second surface of the support member on the second side and the pyroelectric detection element is less than a layer thickness of the second reducing gas barrier layer.

5. The pyroelectric detector according to claim 4, further comprising
an electrical insulation layer having a contact hole filled by the plug, the electrical insulation layer covering the second reducing gas barrier layer,
an electrode wiring layer formed on the electrical insulation layer and connected to the plug, and
a passivation layer disposed outwardly of the electrical insulation layer and electrode wiring layer,
the electrical insulation layer having a smaller amount of reducing gas component than the passivation layer.

6. The pyroelectric detector according to claim 5, further comprising
a third reducing gas barrier layer disposed between the passivation layer and the electrical insulation layer and the electrode wiring layer.

7. A pyroelectric detection device comprising:
a plurality of the pyroelectric detectors according to claim 1 arranged in two dimensions along two axes.

8. A pyroelectric detection device comprising:
a plurality of the pyroelectric detectors according to claim 2 arranged in two dimensions along two axes.

9. A pyroelectric detection device comprising:
a plurality of the pyroelectric detectors according to claim 3 arranged in two dimensions along two axes.

10. A pyroelectric detection device comprising:
a plurality of the pyroelectric detectors according to claim 4 arranged in two dimensions along two axes.

11. A pyroelectric detection device comprising:
a plurality of the pyroelectric detectors according to claim 5 arranged in two dimensions along two axes.

12. A pyroelectric detection device comprising:
a plurality of the pyroelectric detectors according to claim 6 arranged in two dimensions along two axes.

* * * * *